(12) United States Patent
Kobayashi et al.

(10) Patent No.: US 10,720,885 B2
(45) Date of Patent: Jul. 21, 2020

(54) LOW POWER OSCILLATOR USING FLIPPED-GATE MOS

(71) Applicant: Dialog Semiconductor (UK) Limited, London (GB)

(72) Inventors: Daisuke Kobayashi, Tokyo (JP); Julian Tyrrell, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 157 days.

(21) Appl. No.: 15/668,858

(22) Filed: Aug. 4, 2017

(65) Prior Publication Data

US 2019/0044478 A1 Feb. 7, 2019

(51) Int. Cl.
| | |
|---|---|
| *H03K 3/26* | (2006.01) |
| *H03B 5/02* | (2006.01) |
| *H03K 3/354* | (2006.01) |
| *H03K 3/0231* | (2006.01) |
| *H03B 1/02* | (2006.01) |
| *H03K 4/502* | (2006.01) |

(52) U.S. Cl.
CPC .............. *H03B 5/02* (2013.01); *H03B 1/02* (2013.01); *H03K 3/0231* (2013.01); *H03K 3/354* (2013.01); *H03B 2200/005* (2013.01); *H03B 2200/0062* (2013.01); *H03B 2200/0082* (2013.01); *H03B 2201/0275* (2013.01); *H03K 4/502* (2013.01)

(58) Field of Classification Search
CPC .... H03B 5/02; H03B 1/02; H03B 2201/0275; H03B 2200/0062; H03B 2200/005; H03B 2200/0082; H03K 3/354; H03K 3/0231; H03K 4/502

USPC .......................................... 331/111, 143, 145
See application file for complete search history.

(56) References Cited

U.S. PATENT DOCUMENTS

| | | | |
|---|---|---|---|
| 4,559,694 A | 12/1985 | Yoh et al. | |
| 4,623,851 A * | 11/1986 | Abou | .................. H03K 3/0231 331/111 |
| 5,384,740 A | 1/1995 | Etoh et al. | |
| 6,020,792 A | 2/2000 | Nolan et al. | |
| 6,535,435 B2 | 3/2003 | Tanaka et al. | |
| 7,486,151 B2 * | 2/2009 | Goudo | .................. H03K 3/011 331/111 |

(Continued)

FOREIGN PATENT DOCUMENTS

WO  WO 2016/097699  6/2016

OTHER PUBLICATIONS

"Kickback Noise Reduction Techniques for CMOS Latched Comparators," by Pedro M. Figueiredo et al., IEEE Transactions on Circuits and Systems—II: Express Briefs, vol. 53, No. 7, Jul. 2006, pp. 541-545.

(Continued)

*Primary Examiner* — Richard Tan
(74) *Attorney, Agent, or Firm* — Saile Ackerman LLC; Stephen B. Ackerman; Billy Knowles

(57) ABSTRACT

Relax oscillation circuits have at least one comparison circuit that is structured with a flipped gate transistor and a normal MOS transistor wherein the two transistors having different threshold voltages. The relaxation oscillators are configured for charging and discharging capacitances between the threshold voltages of the flipped gate transistor and the normal MOS transistor by toggling the state of a latching circuit to control the charging and discharging of the capacitances.

38 Claims, 16 Drawing Sheets

(56) References Cited

U.S. PATENT DOCUMENTS

| | | | | |
|---|---|---|---|---|
| 8,232,846 B1* | 7/2012 | De Vita | ............... | H03K 4/502 |
| | | | | 331/111 |
| 8,917,147 B2* | 12/2014 | Vasishtha | ............... | H03B 5/36 |
| | | | | 327/47 |
| 9,503,058 B1 | 11/2016 | Cical et al. | | |
| 2003/0155982 A1* | 8/2003 | Hollinger | ............ | H03K 3/0231 |
| | | | | 331/46 |
| 2008/0204155 A1* | 8/2008 | Olmos | ................. | H03K 3/011 |
| | | | | 331/108 R |
| 2015/0234413 A1 | 8/2015 | Al-Shyoukh et al. | | |

OTHER PUBLICATIONS

"MOS Voltage Reference Based on Polysilicon Gate Work Function Difference," by Henri J. Oguey et al., IEEE Journal of Solid-State Circuits, vol. SC-15, No. 3, Jun. 1980, pp. 264-269.

"CMOS Voltage Reference Based on Gate Work Function Differences in Poly-Si Controlled by Conductivity Type and Impurity Concentration," by Hirobumi Watanabe et al., IEEE Journal of Solid State Circuits, vol. 38, No. 6, Jun. 2003, pp. 987-994.

Co-pending U.S. Patent DS16-046, "High Precision Voltage Reference Circuit," U.S. Appl. No. 15/340,200, filed Nov. 1, 2016, by Susumu Tanimoto et al., 20 pgs.

\* cited by examiner

US 10,720,885 B2

LOW POWER OSCILLATOR USING FLIPPED-GATE MOS

TECHNICAL FIELD

The disclosure generally relates to oscillator circuits and more particularly to low power relaxation oscillator circuits.

BACKGROUND

FIG. 1. is a schematic diagram of a relaxation oscillator of the prior art. The PMOS transistors P1 and P2 and the biasing current source IBIAS are configured as a current mirror. The PMOS transistor P1 and the biasing current source IBIAS are connected serially to form the reference leg of the current mirror. The PMOS transistor P2 is connected as the mirror leg of the current source to provide the mirror current IM1 that mirrors the current from the current source IBIAS. The mirror current IM1 flows from the PMOS transistor P2 to a first common terminal CT of the double pole switch S1. A normally closed terminal NCT is connected to a first plate of a capacitor C2 and a first contact terminal NOT of the normally open switch S3. A second plate of the capacitor C2 and the common terminal CT of the normally open switch S3 are connected to a ground reference source. A normally open terminal NOT is connected to a first plate of a capacitor C1 and a first contact terminal NCT of the normally closed switch S2. A second plate of the capacitor C1 and the common terminal CT of the normally closed switch S2 are connected to a ground reference source.

The normally open terminal NOT of the double pole switch S1 is also connected to the inverting input (−) of the first comparator COMP1 and the normally closed terminal NCT of the double pole switch S1 is connected to the inverting input (−) of the second comparator COMP2. The noninverting inputs of the first comparator COMP1 and the second comparator COMP2 are connected to the reference voltage source $V_{REF}$. The output of the first comparator COMP1 is connected to the reset input RST of the set/reset latch L1 and the output of the second comparator COMP2 is connected to the set input SET of the set/reset latch L1.

The output CLK of the set/reset latch L1 is output signal of the relaxation oscillator of the prior art. The output CLK of the set/reset latch L1 also acts as a switch control for the double pole switch S1, the normally closed switch S2, and the normally open switch S3. The output CLK of the set/reset latch L1 is connected to the control terminals of the double pole switch S1, the normally closed switch S2, and the normally open switch S3.

In operation, the output CLK of the set/reset latch L1 is initially set to the reset state (0) such that the double pole switch S1 is in its normally closed state, the normally closed switch S2 is in its normally closed state, and the normally open switch S3 is in its normally open state. When the double pole switch S1 is in the normally closed state, the common terminal CT of the double pole switch S1 is connected to the normally closed terminal NCT thus passing the mirror current IM1 to the capacitor C2. The capacitor C2 charges until the voltage developed across the capacitor C2 is greater than the reference voltage $V_{REF}$. At which time, the comparator COMP2 has a voltage I state (0) that is inverted by the set input SET of the set/reset latch L1 to force the output CLK to the set state (1) to activate the double pole switch S1, the normally closed switch S2, and the normally open switch S3.

The double pole switch S1 is toggled such that the normally open terminal NOT now transfers the mirror current IM1 to the capacitor C1. The normally closed switch S2 is opened to allow the mirror current IM1 to charge the capacitor C1. The normally open switch S3 is closed and the capacitor C2 is discharged to ground. The voltage across the capacitor C1 charges until the voltage across it is greater than the reference voltage VREF. At which time, the comparator COMP1 has a voltage state (0) that is inverted by the reset input RST of the set/reset latch L1 to force the output CLK to the reset state (0) to deactivate the double pole switch S1, The double pole switch S1 is toggled such that the normally closed terminal NCT now transfers the mirror current IM1 to the capacitor C2 to start the next cycle. The circuit continues to oscillate with each of the capacitors charging and discharging based on the setting and resetting of the set/reset latch L1.

The reference voltage $V_{REF}$ is generated by a voltage source (not shown) that is generally a circuit separate from the relaxation oscillator. In many implementations of the voltage source that generates the reference voltage $V_{REF}$, the voltage source is a bandgap voltage reference that is a temperature independent voltage reference circuit. The bandgap reference voltage is sensible to use in a very low power device because of its small bias current.

However, a negative factor affecting the operation of the relaxation oscillator as described above is kickback noise from the comparators COMP1 and COMP2 that can shift the reference voltage $V_{REF}$. The kickback noise is the switching signals during the operation inside a comparator that is fed through capacitances of the input MOS transistors of the comparators COMP1 and COMP2 back to their inputs thus affecting the voltage level of the reference voltage $V_{REF}$.

A second negative factor affecting the operation of the relaxation oscillator as described above is the power consumption comparators COMP1 and COMP2. A third negative factor affecting the operation of the relaxation oscillator is that the comparators COMP1 and COMP2 have an output signal duty cycle that is not 50% due to mismatches of capacitors C1 and C2 and the voltage offsets of the comparators COMP1 and COMP2. In some applications for the relaxation oscillator, both rising and falling edges are used for timers to halve oscillator frequency and power. Accuracy is improved for such dual edge timers if 50% duty cycle is guaranteed.

SUMMARY

An object of this disclosure is to provide relaxation oscillator circuits that eliminate kickback noise to a reference voltage source while reducing comparator power and ensuring a 50% duty cycle.

Another object of this disclosure is to provide relaxation oscillator circuits with a built-in reference voltage structured between two transistors having different threshold voltages.

To accomplish at least one of these objects, a relaxation oscillator has a capacitor with two plates connected to a toggle circuit. The toggle circuit is configured for transferring a charging current from current source to a first plate and from a second plate in a first operating state and transferring the charging current from the current source to the second plate and from the first plate in a second operating state.

The relaxation oscillator has a latch that provides a memory cell for maintaining the state of the relaxation oscillator and providing the oscillator output signal. A first of the inputs of the latch are the indicator for the first state that is applied to the reset input of the latch. The second of the inputs is the indicator for the second state that is applied to the set input of the latch.

The relaxation oscillator has a trigger circuit that has a first sense point connected to the first plate of the capacitor and a second sense point connected to the second plate of the capacitor. The sense points enable the trigger circuit to determine the voltage developed across the capacitor. A first threshold voltage source and a second voltage source respectively provide the trigger voltages that set the voltage at which the trigger circuit changes the trigger indicator output and at the outputs of the trigger circuit. The trigger circuit indicates that the relaxation oscillator is to change from a first state when the voltage across the capacitor is greater than the first trigger voltage and to change from the second state when the voltage across the capacitor is less than the second trigger voltage.

In the first state, a first state indicator output is activated (1) and the second state indicator output is deactivated (0). In the second state. the first state indicator output is deactivated (0) and the second state indicator output is activated (1). A set/reset latch changes state according the first and second state indicator outputs.

In various embodiments, when the relaxation oscillator is in the first state, the charging current is flowing from the first terminal of the toggle circuit to the first plate of the capacitor and from the second plate of the capacitor to the second terminal of the toggle circuit to discharge the capacitor and charge the capacitor in an opposite polarity. When the voltage across the capacitor reaches the first trigger voltage, the first trigger indicator output is deactivated (0) and the second trigger indicator output is activated (1) and the output of the latch is activated (1) and the state machine enters the second state. The toggle circuit is then changed such that the charging current flows from the second terminal to the second plate of the capacitor and from the first plate of the capacitor to the first terminal if the voltage across the capacitor to discharge the capacitor and recharge the capacitor in the opposite polarity. When the voltage across the capacitor reaches the first trigger voltage, the first trigger indicator output is activated (1) and the second trigger indicator output is deactivated (0) and the output of the latch is deactivated (0) and the state machine enters the second state. The process repeatedly continues providing the relaxation oscillator with a 50% duty cycle and no kickback to a reference voltage source.

In other embodiments, when the relaxation oscillator is in the first state, the charging current is flowing from the first terminal of the toggle circuit to the first plate of the capacitor and from the second plate of the capacitor to the second terminal of the toggle circuit, When the voltage across the capacitor reaches the first trigger voltage, the first trigger indicator output is deactivated (0) and the second trigger indicator output is activated (1) and the output of the latch is activated (1) and the state machine enters the second state. The toggle circuit is then changed such that the charging current flows from the second terminal to the second plate of the capacitor and from the first plate of the capacitor to the first terminal, if the voltage across the capacitor is greater than the second trigger voltage. When the voltage across the capacitor is less than the second trigger voltage, the trigger indicator output is activated (1) and the trigger indicator output is deactivated (0) and the output of the latch is deactivated (0) and the state machine enters the second state. The process repeatedly continues providing the relaxation oscillator with a 50% duty cycle and no kickback to a reference voltage source.

The trigger circuit has a pair of flipped-gate transistors and a pair of normal transistors where each flipped gate transistor has a threshold voltage level that differs from the threshold voltage level of the normal transistor by a bandgap voltage of the semiconductor material from which the flipped gate transistor and normal transistor are manufactured. The normal transistors are each configured to provide the first trigger voltage and the flipped gate transistors are configured to provide the second trigger voltage.

The toggle circuit charges the capacitor such that the flipped gate threshold voltage level is developed across the capacitor from a first plate to a second plate of the capacitor to set the latch and charges the capacitor from the second plate to first plate to reset the latch.

In various embodiments that have two capacitors that are connected from the gates of the normal transistors and the gates of the flipped gate transistors, the toggle circuit is charging one capacitor while discharging the second capacitor to set or reset the set/reset latch. In some embodiments, the capacitor is the gate to source capacitor of the normal transistor of the branch of the trigger circuit.

In various embodiments, the trigger circuit has a single flipped gate transistor and a normal transistor. The single flipped-gate transistor is configured as a diode with the gate and drain connected to provide the second trigger voltage. A first current source provides a current to the flipped-gate transistor for biasing the flipped-gate transistor to generate the second trigger voltage. Each normal transistor has its gate connected to the gate of the flipped gate transistor. The drain of each of the normal transistors is connected to a current source for receiving a constant current. The source of one normal transistor is connected a first plate of a second capacitor and the source of a second normal transistor is connected a first plate of a third capacitor. The toggle circuit consists of two switches connected in parallel with each of the capacitors for discharging the capacitors. The control terminal of one switch is connected to the set input of the set/reset latch and the control terminal of the second switch is connected to the reset input of the set/reset latch.

One of the normal transistors connected to the set input will turn off to activate the set output and deactivate the reset output of the set/reset latch. The second normal transistor connected to the reset input will activate the reset output and deactivate the set output of the reset latch. This will allow the alternate charging and discharging of the capacitors connected to the sources of the normal transistors and the switches of the toggle circuit to generate the output signal of the relaxation oscillator.

In various embodiments, a relaxation oscillator has a trigger circuit with one flipped-gate transistor and one normal transistor. The relaxation oscillator has a capacitor where the first plate of a capacitor is connected to the gates of the flipped-gate transistor and the normal transistor. A current source and a current sink are connected through current source gating transistors of the toggle circuit to the first plate of the capacitor for charging and discharging the capacitor.

The drain of the flipped-gate transistor is connected to a current source to receive a constant current. The drain of a gating transistor is connected to the drain of the flipped-gate transistor. The source of the gating transistor is connected to the drain of the normal transistor. An input of an inverter is connected to the drains of the flipped-gate transistor and the gating transistor. The output of the inverter is connected to the gate of the gating transistor and the gates of the current source gates.

One current source gating transistor connected to the current source is turned on to charge the capacitor until flipped gate transistor turns on and the inverter changes state at which time the current source gating transistor of the charging current source turns off and the current source gating transistor of the current sink turns on to discharge the capacitor. The flipped gate transistor changes state again and the process is repeated to maintain oscillation of the relaxation oscillator.

DETAILED DESCRIPTION

The relaxation oscillator of this disclosure has a frequency determining capacitor where a voltage swing across the capacitor is defined by two different threshold voltages that differ by the bandgap of the semiconductor material from which the transistors are manufactured. To achieve the differences in the threshold levels, one transistor is a normal transistor manufactured using present materials and fabrication techniques and the second transistor is a flipped gate transistor as described in FIG. 2b.

Figure 2A:
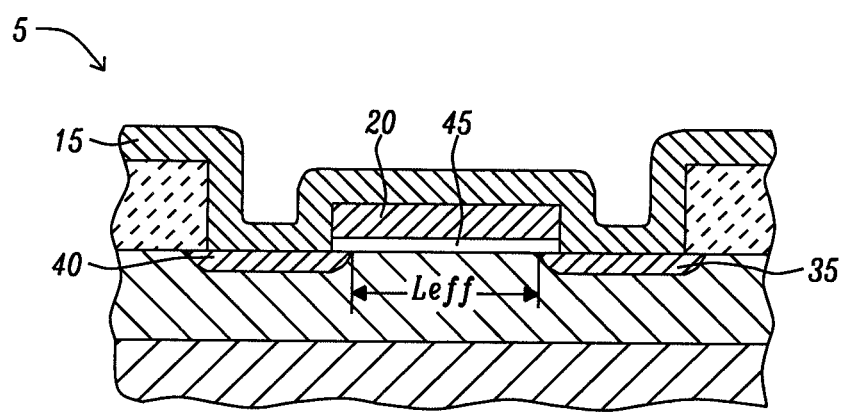
FIG. 2a is a cross sectional diagram of a MOS transistor of the related art.
Figure 2B:
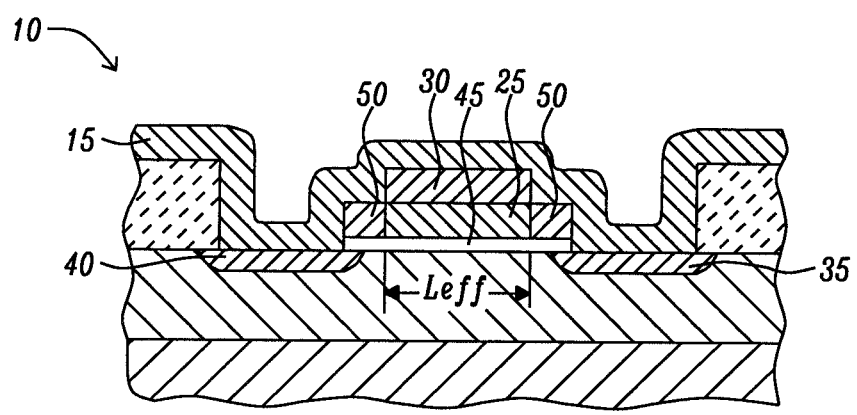
FIG. 2b is a cross sectional diagram of a Flipped-Gate MOS transistor of the related art.

FIGS. 2a and 2b are a cross sectional diagrams respectively of a MOS transistor and a flipped-gate MOS transistor of the related art. In the related art as shown in FIGS. 2a and 2b, a flipped-gate transistor (FIG. 2b) has a threshold voltage that is greater than the threshold voltage of a normal transistor. The normal transistor is defined is one that employs the standard processing currently in practice and is similar to that shown in FIG. 2a. "MOS voltage reference based on polysilicon gate work function difference," Oguey, et al., IEEE Journal of Solid-State Circuits, vol. 15, no. 3, pp. 264-269, June 1980 shows in FIGS. 3a and 3b and reproduced in FIGS. 2a and 2b. Quoting from Oguey et al., FIG. 3a (FIG. 2a of the present disclosure) shows a standard n-channel transistor 5 with an n-type gate 20 and FIG. 3b (FIG. 2b of the present disclosure) modified n-channel transistor 10 with a p-type gate 25 fabricated with a technology that uses doped oxides as diffusion sources. In the standard transistor 5, gate 20, drain 35, and source 40 are surrounded by a phosphorus-doped oxide 15. Source 40 and drain 35 are self-aligned with the gate 20. Effective channel length Leff is gate length minus two lateral diffusion lengths. In the modified transistor, the center part of the gate 25 is p-doped by leaving above it a region of boron-doped oxide 30. This structure behaves like a higher threshold transistor of channel length Leff in series with two short-channel low-threshold transistors. The additional transistors 50 produce a negligible effect in weak inversion, but contribute to a larger change in gate threshold voltage at higher current levels.

Figure 3B:
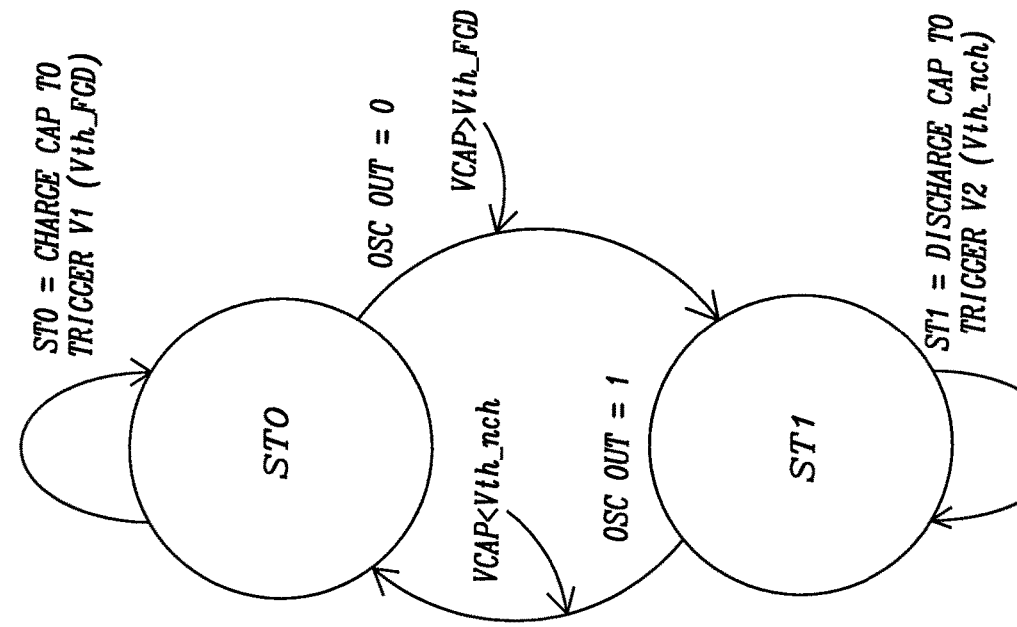
FIGS. 3a and 3b are a state diagrams illustrating the operation of a state machine implementing a relaxation oscillator embodying the principles of the present disclosure.
Figure 3A:
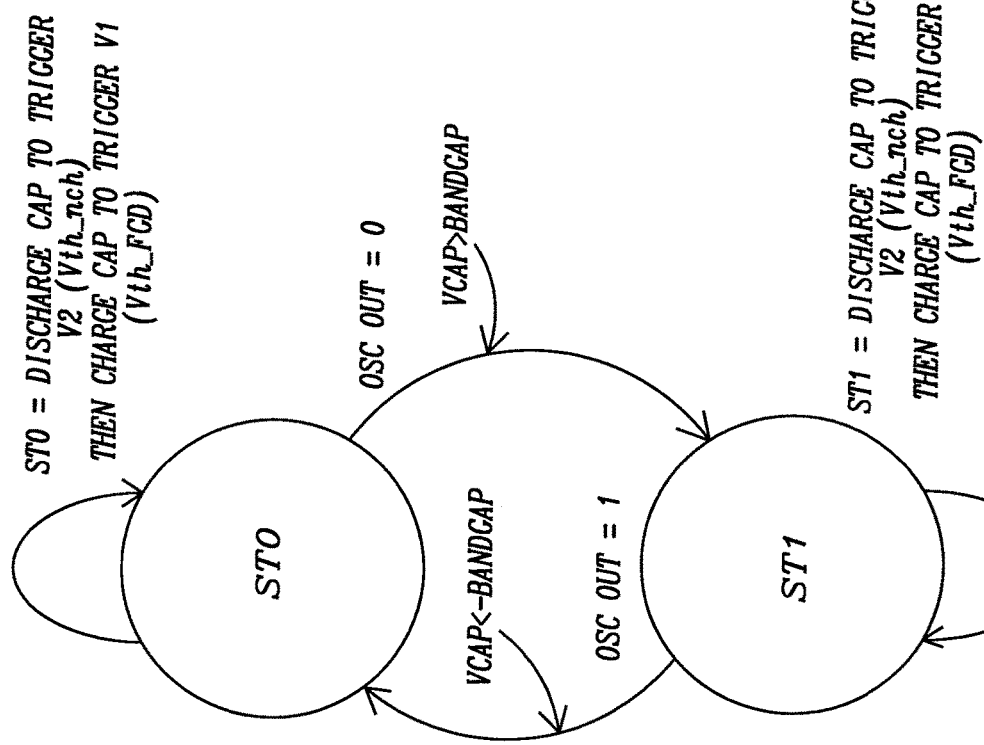

FIG. 3a is a state diagram illustrating the operation of a state machine implementing a relaxation oscillator embodying the principles of the present disclosure. In FIG. 3a, the state machine starts in state ST0 with the output of the oscillator OUT being at the activated (1) state. A capacitor (described hereinafter) is charged until the voltage VCAP developed across the capacitor is greater than the positive bandgap (VCAP=BANDGAP) at which time the oscillator output OUT is deactivated (0). The state machine transfers to the state ST1 and the capacitor is discharged until the voltage developed across the capacitor is less than the trigger point V2 (Vth_nch). The capacitor then is charged in an opposite direction until the voltage developed across the capacitor is greater than the trigger point V1 (Vth_FGD). When the capacitor has discharged such that the voltage VCAP developed across the capacitor is less than the negative bandgap (VCAP=−BANDGAP), the state machine transfers back to the state ST0. The oscillator output OUT is activated (1) and the capacitor is discharged until the voltage developed across the capacitor is less than the trigger point V2 (Vth_nch). The capacitor then is charged in an opposite direction until the voltage developed across the capacitor is greater than the trigger point V2 (Vth_FGD). The cycle is repeated continuously.

FIG. 3b is a state diagram illustrating the operation of a state machine implementing a relaxation oscillator embodying the principles of the present disclosure. In FIG. 3, the state machine starts in state ST0 with the output of the oscillator OUT being at the activated (1) state. A capacitor (described hereinafter) is charged until the voltage VCAP developed across the capacitor is greater than the trigger point V1 (Vth_FGD) at which time the oscillator output OUT is deactivated (0). The state machine transfers to the state ST1 and the capacitor is discharged until the voltage developed across the capacitor is less than the trigger point V2 (Vth_nch). When the capacitor has discharged such that the voltage VCAP developed across the capacitor is less than the trigger point V2 (Vth_FGD), the state machine transfers back to the state ST0. The oscillator output OUT is deactivated (0) and the capacitor is charged until the voltage developed across the capacitor is greater than the trigger point V1 (Vth_FGD) at which time the oscillator output OUT is deactivated (0). The cycle is repeated continuously.

Figure 4:
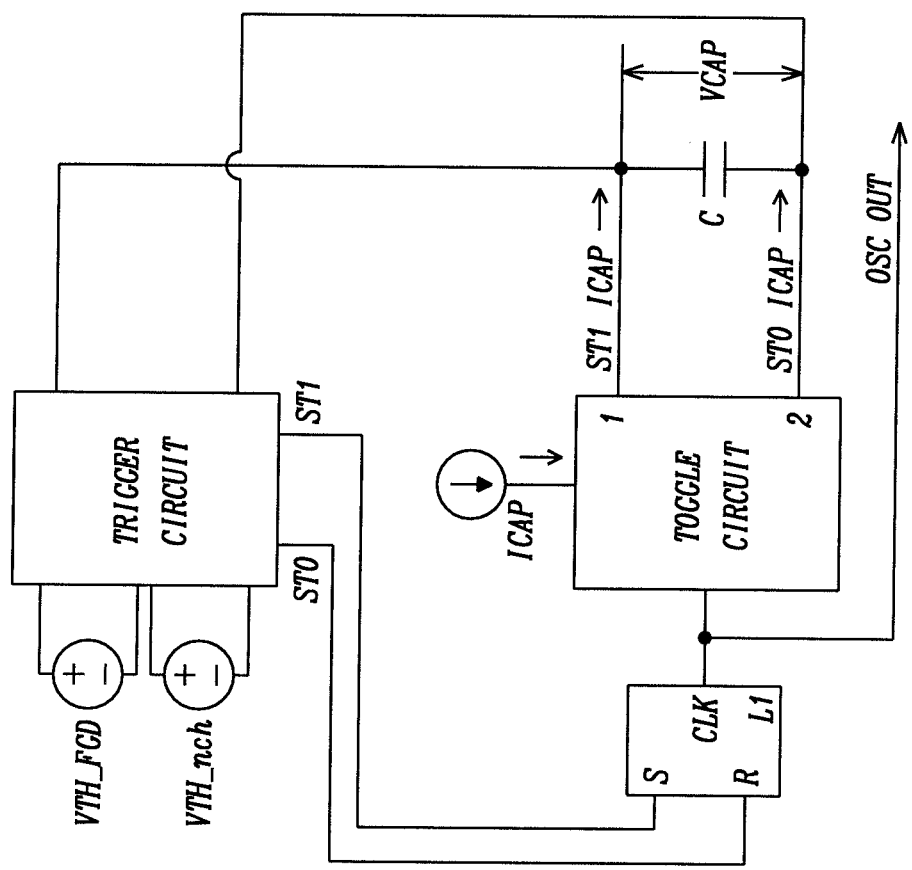
FIG. 4 is a functional block diagram illustrating the functional structure of a relaxation oscillator embodying the principles of the present disclosure.

FIG. 4 is a functional block diagram illustrating the functional structure of a relaxation oscillator embodying the principles of the present disclosure. The relaxation oscillator has a capacitor C having both of its plates connected to a toggle circuit TGL for transferring a charging current from current source ICAP alternately to the first plate and from the second plate of the capacitor C in a first state ST0 and transferring the charging current from the current source ICAP to the second plate and from the first plate of the capacitor C in a second state ST1. The first terminal T1 of the toggle circuit TGL is connected to the first plate of the capacitor C and the second terminal T2 of the toggle circuit TGL is connected to the second plate of the capacitor C.

A latch L1 provides a memory cell for maintaining the state of the relaxation oscillator and providing the oscillator output signal OUT. The first of the inputs of the latch L1 is the indicator for the first state ST0 applied to the reset input R of the latch L1. The second of the inputs is the indicator for the second state ST1 that is applied to the set input S of the latch L1.

The relaxation oscillator has a trigger circuit TGR that has a sense point S1 connected to the first plate of the capacitor C and a sense point S2 connected to the second plate of the capacitor C. The sense points S1 and S2 enable the trigger circuit to determine the voltage VCAP developed across the capacitor. The voltage sources V1 and V2 respectively provide the trigger voltages Vth_FGD and Vth_nch that set the voltage at which the trigger circuit TGR changes the trigger indicator output CMP1 and CMP2 at the outputs of the trigger circuit TGR. In the embodiments of this application the voltage sources V1 and V2 are implemented using a first flipped gate transistor having a threshold voltage that is the trigger voltage Vth_FGD and a normal NMOS transistor having a threshold voltage that is the trigger voltage Vth_nch. In the first state ST0, the trigger indicator output CMP1 is activated (1) and the trigger indicator output CMP2 is deactivated (0). In the second state ST1, the trigger indicator output CMP1 is deactivated (0) and the trigger indicator output CMP1 and CMP2 is activated (1). The set/reset latch changes state according the trigger indicator outputs CMP1 and CMP2.

If the relaxation oscillator implements the state machine of FIG. 3a, when the relaxation oscillator is in the first state ST0, the voltage VCAP across the capacitor C is less than the trigger voltages Vth_FGD and the charging current ICAP is flowing from the first terminal T1 of the toggle circuit TGL to the first plate of the capacitor C and from the second plate of the capacitor C to the second terminal T2 of the toggle circuit When the voltage VCAP across the capacitor C reaches the trigger voltage that is the bandgap voltage that is equal to the difference of the trigger voltages Vth_FGD and Vth_nch, trigger indicator output CMP1 is deactivated (0) and the trigger indicator output CMP2 is activated (1) and the output of the latch L1 is activated (1) the state machine enters the second state ST1. The toggle circuit TGL is then changed such that the charging current ICAP flows from the second terminal T2 to the second plate of the capacitor C and from the first plate of the capacitor C to the first terminal T1 until the voltage VCAP across the capacitor C is greater than the trigger voltage Vth_nch. The capacitor C is then charged in the opposite polarity until voltage VCAP developed across the capacitor C VCAP reaches the trigger voltage that is the negative bandgap voltage that is equal to the negative of the difference of the trigger voltages Vth_FGD and Vth_nch. When the voltage VCAP across the capacitor C reaches the trigger voltage Vth_nch, trigger indicator output CMP1 is activated (1) and the trigger indicator output CMP2 is deactivated (0) and the output of the latch L1 is deactivated (0) the state machine enters the second state ST0. The process repeatedly continues providing the relaxation oscillator with a 50% duty cycle and no kickback to a reference voltage source.

If the relaxation oscillator implements the state machine of FIG. 3b, when the relaxation oscillator is in the first state ST0, the voltage VCAP across the capacitor C is less than the trigger voltages Vth_FGD and the charging current ICAP is flowing from the first terminal T1 of the toggle circuit TGL to the first plate of the capacitor C and from the second plate of the capacitor C to the second terminal T2 of the toggle circuit When the voltage VCAP across the capacitor C reaches the trigger voltage Vth_FGD, trigger indicator output CMP1 is deactivated (0) and the trigger indicator output CMP2 is activated (1) and the output of the latch L1 is activated (1) the state machine enters the second state ST1. The toggle circuit TGL is then changed such that the charging current ICAP flows from the second terminal T2 to the second plate of the capacitor C and from the first plate of the capacitor C to the first terminal T1 as long as the voltage VCAP across the capacitor C is greater than the trigger voltage Vth_nch. When the voltage VCAP across the capacitor C reaches the trigger voltage Vth_nch, trigger indicator output CMP1 is activated (1) and the trigger indicator output CMP2 is deactivated (0) and the output of the latch L1 is deactivated (0) the state machine enters the second state ST0. The process repeatedly continues providing the relaxation oscillator with a 50% duty cycle and no kickback to a reference voltage source.

Figure 5A:
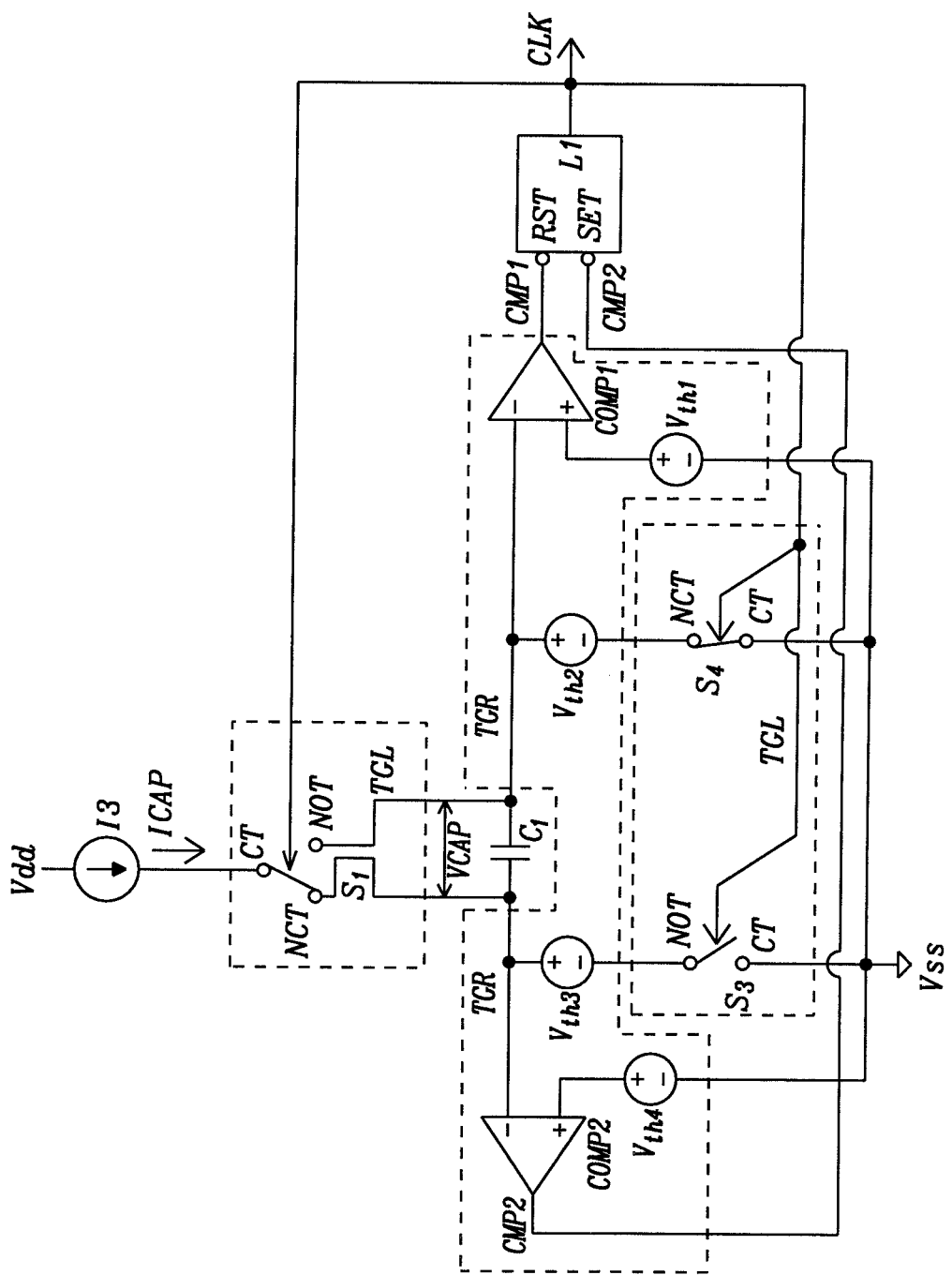
FIG. 5a is a simplified schematic diagram of one implementation of a relaxation oscillator embodying the principals of the present disclosure.

FIG. 5a is a simplified schematic diagram of one implementation of a relaxation oscillator embodying the principals of the present disclosure according to the state diagram of FIG. 3a. The toggle circuit TGL and the trigger circuit TGR are connected to a first and second plates of the capacitor $C_1$ as described in FIG. 4. The toggle circuit has a toggle switch $S_1$ having a normally open terminal NOT connected to the first plate of the capacitor $C_1$ and a normally closed terminal NCT connected to the second plate of the capacitor $C_1$. The common terminal CT of the switch $S_1$ is connected to a first terminal of a capacitor charging current source ICAP. A second terminal of the capacitor charging current source ICAP is connected to a power supply voltage source Vdd. The trigger circuit TGR provides the toggle signal from the clock signal CLK to the control terminal of the switch $S_1$.

The trigger circuit TGR has a first comparator circuit COMP1 with an inverting input (−) connected to the first plate of the capacitor $C_1$ and the normally opened terminal NOT of the switch $S_1$. A noninverting input (+) of the first comparator COMP1 is connected to a first terminal the first trigger voltage source $V_{th1}$ that provides to a threshold voltage Vth_FGD that is equal to that of a flipped gate MOS transistor as described in FIG. 2b. A second terminal of the first trigger voltage source $V_{th1}$ is connected to the reference voltage source Vss. A second trigger voltage source $V_{th2}$ and provides a threshold voltage Vth_nch that is equal to that of a normal MOS transistor as described in FIG. 2a to the noninverting terminal (+) of the comparator COMP1. A second terminal of the second trigger voltage source $V_{th2}$ is connected to the toggle circuit TGL.

The trigger circuit TGR has a second comparator circuit COMP2 with an inverting input (−) connected to the second plate of the capacitor $C_1$ and the normally closed terminal NCT of the switch $S_1$. A noninverting input (+) of the second comparator COMP2 is connected to a first terminal the third trigger voltage source $V_{th3}$ that provides to a threshold voltage Vth_FGD that is equal to that of a flipped gate MOS transistor as described in FIG. 2b. A second terminal of the third trigger voltage source $V_{th3}$ is connected to the reference voltage source Vss. A fourth trigger voltage source $V_{th4}$ and provides a threshold voltage Vth_nch that is equal to that of a normal MOS transistor as described in FIG. 2a to the noninverting terminal (+) of the comparator COMP2. A second terminal of the fourth trigger voltage source $V_{th2}$ is connected to the toggle circuit TGL.

The toggle circuit has a second switch $S_2$ that has its normally closed terminal NCT connected to the second terminal of the second trigger voltage source $V_{th3}$. The common terminal CT of the second switch $S_2$ is connected to the reference voltage source Vss. The toggle circuit has a third switch $S_3$ that has its normally opened terminal NOT connected to the second terminal of the third trigger voltage source $V_{th3}$. The common terminal CT of the second switch $S_3$ is connected to the reference voltage source Vss.

The output terminal of the first comparator COMP1 provides the trigger indicator output CMP1 to the reset terminal RST of the latch L1 and the output terminal of the second comparator COMP2 provides the trigger indicator output CMP2 to the set terminal SET of the latch L1. The output of the latch L1 is the clock signal CLK that is transferred to external circuits. The control terminals of the switches S1, S2, and S2 are connected output CLK of the latch L1 for toggling the relaxation oscillator between the first state ST0 and the second state ST1 as shown in FIG. 3a.

Figure 5B:
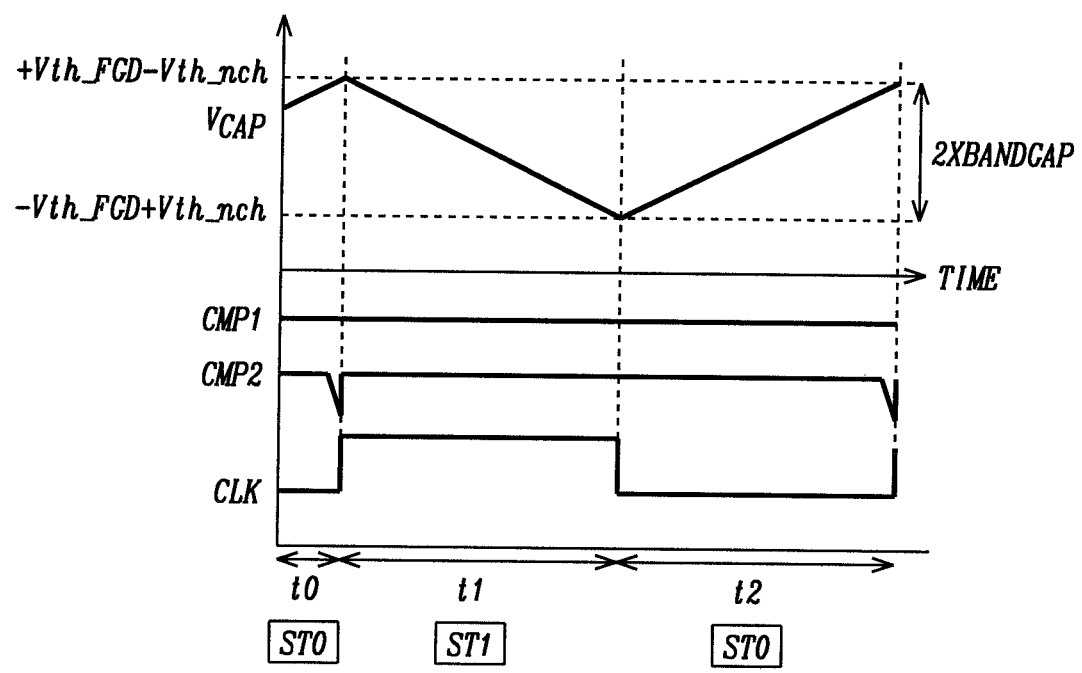
FIG. 5b is a plot showing signals at various points during operation of the relaxation oscillator of FIG. 5s embodying the principals of the present disclosure.

FIG. 5b is a plot showing signals at various points during operation of the relaxation oscillator of FIG. 5a embodying the principals of the present disclosure. During the time period τ0, the latch L1 is placed in the state ST0 and the clock is deactivated (0). The voltage developed across the capacitor $C_1$ rises to the positive bandgap voltage (+Vth_FGD−Vth_nch). At which time, the trigger indicator CMP2 sets the latch L1 and the relaxation oscillator is placed in the state ST1 and the clock CLK changes to the active state (1). During the time period τ1, the voltage developed across the capacitor $C_1$ falls to the negative bandgap voltage −(Vth_FGD−Vth_nch). At which time, the trigger indicator CMP1 resets the latch L1 and the relaxation oscillator is placed in the state ST0 and the clock CLK changes to the inactive state (0). During the time period τ2, the voltage developed across the capacitor $C_1$ rises to the positive bandgap voltage (+Vth_FGD−Vth_nch). At which time, the trigger indicator CMP2 sets the latch L1 and the relaxation oscillator is placed in the state ST1 and the clock CLK changes to the active state (1). This toggling between the state ST0 and the state ST1 continues repeated during the operation of the relaxation oscillator.

Figure 6A:
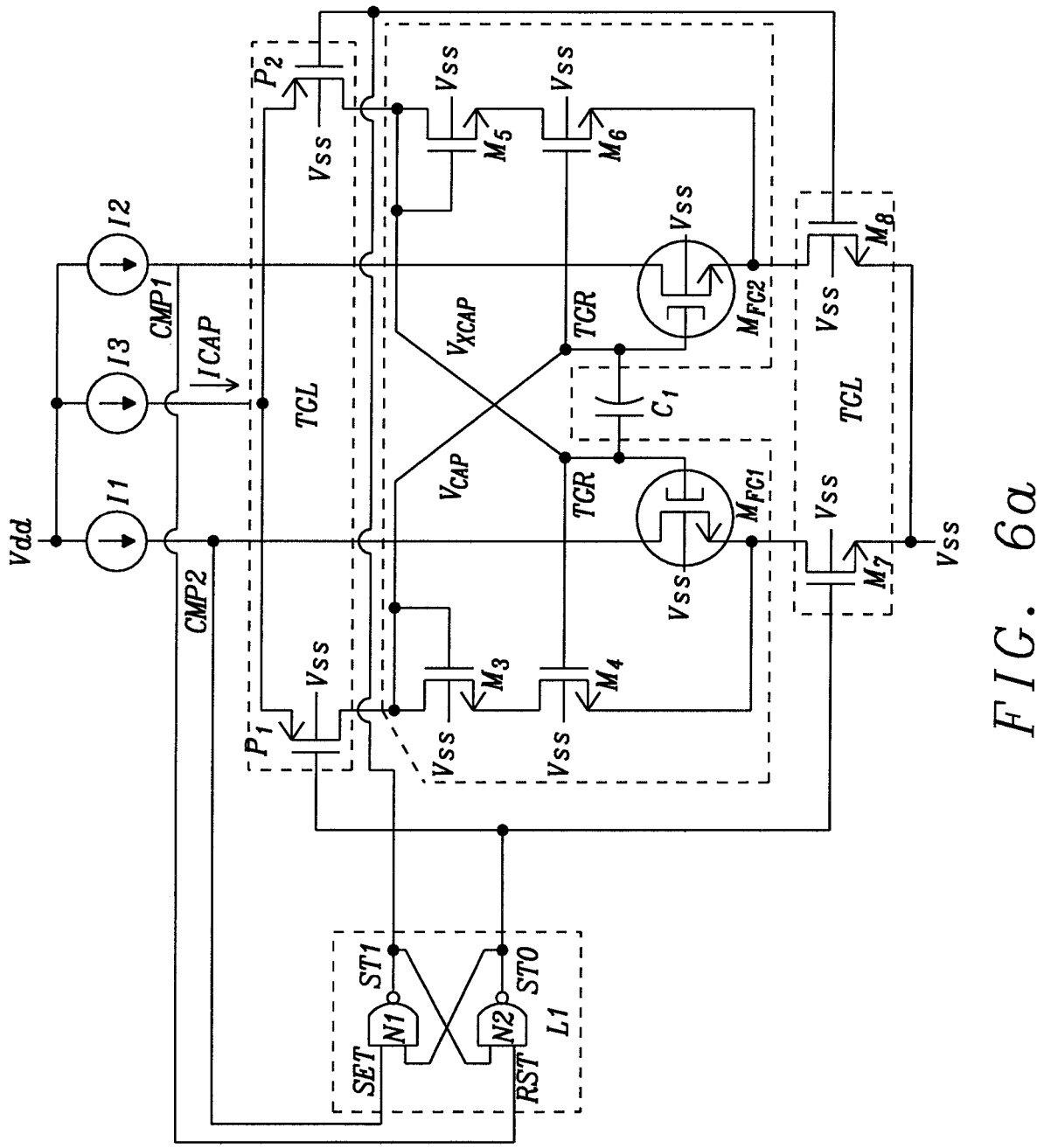
FIG. 6a is a schematic diagram of a second implementation of a relaxation oscillator embodying the principals of the present disclosure.

FIG. 6a is a schematic diagram of one implementation of a relaxation oscillator embodying the principals of the present disclosure. The relaxation oscillator has a frequency determining capacitor $C_1$, toggle circuit TGL, and a trigger circuit of FIG. 4. The trigger circuit is connected to a first plate and second plate of the capacitor $C_1$. The trigger circuit TGR includes a first flipped gate transistor $M_{FG1}$ having a threshold voltage that is the trigger voltage Vth_FGD and a first normal NMOS transistor $M_3$ with a threshold voltage that is the trigger voltage VTH_nch. The first plate of the capacitor $C_1$ is connected to a gate of the first flipped gate transistor $M_{FG1}$ and a gate of the normal NMOS transistor $M_5$. The trigger circuit TGR is connected to a second plate of the capacitor $C_1$. The trigger circuit TGR includes a second flipped gate transistor $M_{FG2}$ having the threshold voltage that is the trigger voltage Vth_FGD and a normal NMOS transistor $M_3$ with a threshold voltage that is the trigger voltage Vth_nch. The second plate of the capacitor $C_1$ is connected to a gate of a second flipped gate transistor $M_{FG2}$ and the normal NMOS transistor $M_3$. As described above, the threshold voltage of the first and second flipped gate transistors $M_{FG1}$ and $M_{FG2}$ and the threshold voltages of the NMOS transistors $M_3$ and $M_5$ are different by a bandgap of a semiconductor material from which the first and second transistors are manufactured. The first threshold voltage is greater than the second threshold voltage because the first and second flipped gate transistor $M_{FG1}$ and $M_{FG2}$ have the structure as described above in FIG. 2b.

A drain of the first flipped gate transistor $M_{FG1}$ is connected for receiving a current from a first current source I1 for providing a comparison signal CMP2. A drain of the second flipped gate transistor $M_{FG2}$ is connected for receiving a current from a second current source I2 for providing a comparison signal CMP1. The relaxation oscillator has a set/reset latch L1 formed of the cross-coupled NAND gates N1 and N2. A first input of the NAND gate N1 forms the SET input of the set/reset latch L1 and is connected to receive the comparison signal CMP2. A second input of the NAND gate N1 is connected to an output ST0 of the second NAND gate N2. The first input of the NAND gate N2 is connected to the output ST1 of the first NAND gate N1. The second input of the NAND gate N2 forms the RESET input of the set/reset latch L1 and is connected to receive the comparison signal CMP1.

A current source $I_3$ provides a capacitor charging current ICAP to the toggle circuit TGL such that the charging current ICAP is selectively transferred to the first plate or the second plate of the frequency determining capacitor $C_1$ and flows through the frequency determining capacitor $C_1$ and the diode connected NMOS transistor $M_3$ and the diode connected NMOS transistor $M_5$ as selected by the toggle circuit TGL. The charging current ICAP provides a biasing current for diode connected of NMOS transistor $M_3$ and the diode connected NMOS transistor $M_5$ as selected by the toggle circuit TGL. The diode connected NMOS transistor $M_3$ and the diode connected NMOS transistor $M_5$ establish the second trigger voltage Vth_nch. The toggle circuit TGL is formed of a PMOS transistor $P_1$, a P-type transistor $P_2$, an NMOS transistor $M_7$, and an NMOS transistor $M_8$. The PMOS transistor $P_1$ and a P-type transistor $P_2$ have a source connected to receive the capacitor charging current ICAP. A gate of the PMOS transistor $P_1$ is connected to receive a reset output signal ST0 from the set/reset latch L1 and a gate of the P-type transistor $P_2$ is connected to receive a set output signal ST1 from the set/reset latch L1.

A drain of the PMOS transistor $P_1$ is connected to the second plate of the capacitor $C_1$ and to a gate and drain of a diode connected of NMOS transistor $M_3$. A source of the diode connected NMOS transistor $M_3$ is connected to the drain of the normal NMOS transistor $M_4$. The sources of the normal NMOS transistor $M_4$ and the first flipped gate transistor $M_{FG1}$ are connected to the drain of the NMOS transistor $M_7$ of the toggle circuit TGL. The source of the NMOS transistor $M_7$ is connected to the reference voltage source Vss. The gate of the NMOS transistor $M_7$ is connected to receive the reset signal ST0.

A drain of the PMOS transistor $P_2$ is connected to the first plate of the capacitor $C_1$ and to a gate and drain of a diode connected of NMOS transistor $M_5$. A source of the diode connected NMOS transistor $M_5$ is connected to the drain of the normal NMOS transistor $M_6$. The sources of the normal NMOS transistor $M_6$ and the first flipped gate transistor $M_{FG2}$ are connected to the drain of the NMOS transistor $M_8$ of the toggle circuit TGL. The source of the NMOS transistor $M_8$ is connected to the reference voltage source Vss. The gate of the NMOS transistor $M_8$ is connected to receive the set signal ST1.

Figure 6B:
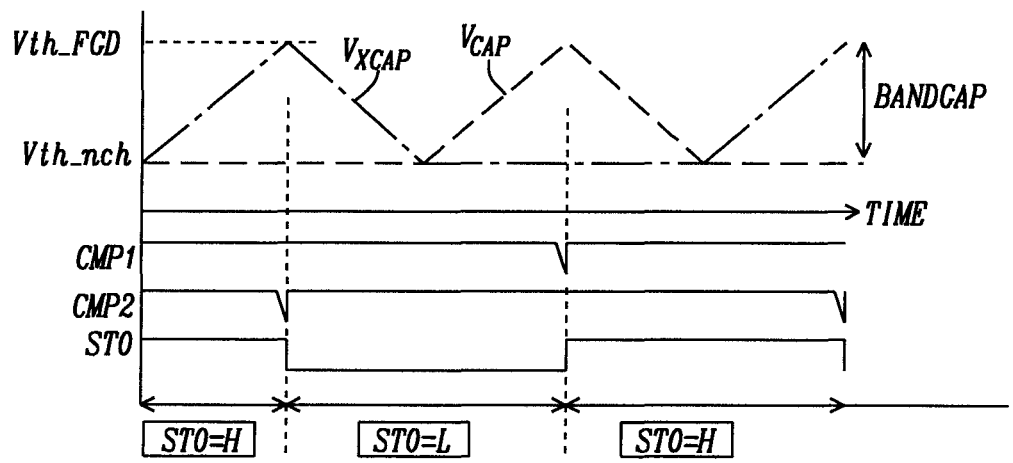
FIG. 6b is a plot showing signals at various points during operation of the relaxation oscillator of FIG. 5 embodying the principals of the present disclosure.
Figure 6C:
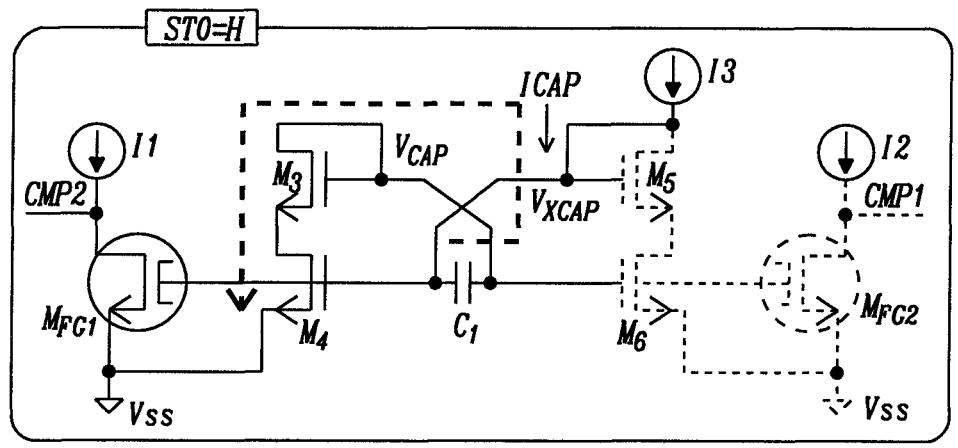
FIGS. 6c-6d are simplified schematics showing the current flow during operation of the relaxation oscillator of FIG. 5 embodying the principals of the present disclosure.
Figure 6D:
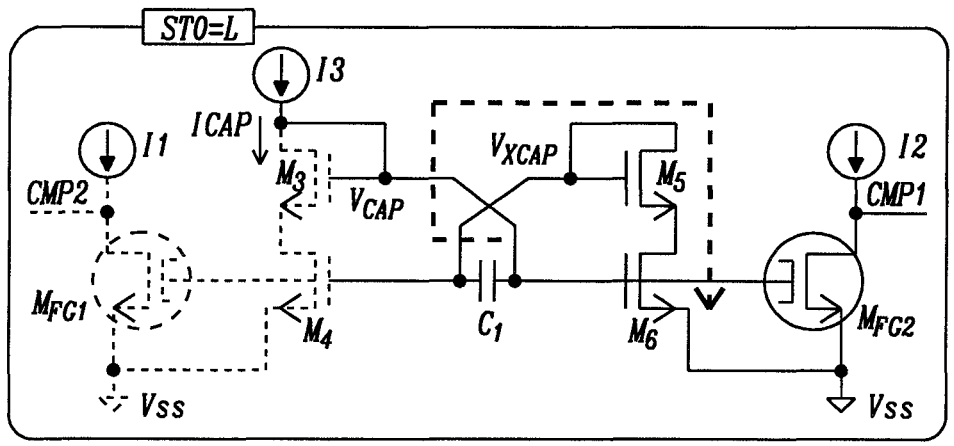

FIG. 6b is a plot showing signals at various points during operation of the relaxation oscillator of FIG. 5a embodying the principals of the present disclosure. FIGS. 6b-6d are simplified schematics showing the current flow during operation of the relaxation oscillator of FIG. 6a embodying the principals of the present disclosure. Referring to FIGS. 6b to 6d for a description of the operation of the relaxation oscillator of FIG. 6a, the reset output ST0 of the set/reset latch L1 is activated (1) and the toggle circuit TGL activates the PMOS transistor $P_2$ and the NMOS transistor $M_7$ such that the current source $I_3$ is connected to charge the first plate of the capacitor $C_1$. The voltage $V_{XCAP}$ at the first plate of the capacitor $C_1$ begins to rise when the voltage $V_{CAP}$ at the second plate of the capacitor $C_1$ reaches the second trigger voltage Vth_nch and the second plate of the capacitor $C_1$ is effectively connected to the second threshold voltage Vth_nch as established by the diode connected NMOS transistor $M_3$. The voltage $V_{XCAP}$ at the first plate the capacitor $C_1$ continues to rise until the first flipped gate transistor $M_{FG1}$ is turned on. At this moment, the voltage across capacitor $C_1$ is the difference between first trigger voltage Vth_FG1 and the second trigger voltage Vth_nch (Vth_FG1–Vth_nch) that is the bandgap voltage. As noted above, the capacitor charging current ICAP not only charges capacitor $C_1$ but also provides the bias current to generate the gate to source voltage for the diode connected NMOS transistor $M_3$ that is the second trigger voltage Vth_nch.

The set input of the set/reset latch L1 is such that the set output ST1 is activated (1) and the reset output ST0 is deactivated (0). The toggle circuit now turns off the PMOS transistor $P_2$ and the NMOS transistor $M_7$ and activates the PMOS transistor $P_1$ and the NMOS transistor $M_8$. The voltage $V_{XCAP}$ at the first plate of the capacitor $C_1$ falls and the voltage $V_{CAP}$ at the second plate of the capacitor $C_1$ begins to rise as the current source $I_3$ is connected to transfer the charging current ICAP to charge the second plate of the capacitor $C_1$.

The voltage $V_{CAP}$ at the second plate of the capacitor $C_1$ rises and the second plate of the capacitor $C_1$ begins to rise when the voltage $V_{XCAP}$ at the second plate of the capacitor $C_1$ reaches the second threshold voltage Vth_nch. The voltage $V_{CAP}$ at the second plate the capacitor $C_1$ continues to rise until the second flipped gate transistor $M_{FG2}$ is turned on. The reset input of the set/reset latch L1 is such that the reset output ST0 is activated (1) and the set output ST1 is deactivated (0). The toggle circuit now turns off the PMOS transistor $P_2$ and the NMOS transistor $M_7$ and turns on the PMOS transistor $P_1$ and the NMOS transistor $M_8$. The voltage $V_{CAP}$ at the second plate of the capacitor $C_1$ falls and the voltage $V_{XCAP}$ at the first plate of the capacitor $C_1$ begins to rise as the current source $I_3$ is connected to transfer the current ICAP to charge the first plate of the capacitor $C_1$. At that time, the current source $I_3$ is connected to charge the first plate of the capacitor $C_1$ as described above.

Figure 7:
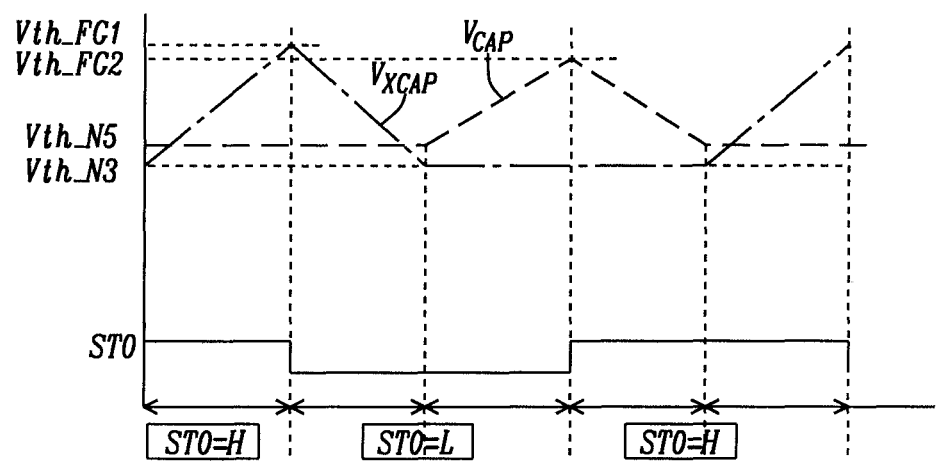
FIG. 7 is a plot showing signals at various points during operation of the relaxation oscillator of FIG. 5 embodying the principals of the present disclosure having mismatched component values.

The oscillator will toggle from one operation mode to the other continually with a fixed 50% duty cycle based on the value of the current source I3 and the capacitor $C_1$. FIG. 7 is a plot showing the voltage $V_{XCAP}$ at the first plate of the capacitor $C_1$, voltage $V_{XCAP}$ at the first plate of the capacitor $C_1$, and the reset output ST0 of the set/reset latch L1 during operation of the relaxation oscillator of FIG. 5 embodying the principals of the present disclosure having mismatches in the threshold voltages of the transistors. The plot shows that the threshold voltage Vth_FG1 of the first flipped gate transistor $M_{FG1}$ is greater than the threshold voltage Vth_FG2 of the second flipped gate transistor $M_{FG2}$. Similarly, the plot shows that the threshold voltage Vth_N5 of the NMOS transistor $M_5$ is greater than the threshold voltage Vth_N3 of the NMOS transistor $M_3$. Even with these mismatches, the output ST0 of the relaxation oscillator maintains a 50% duty cycle during operation.

Figure 8A:
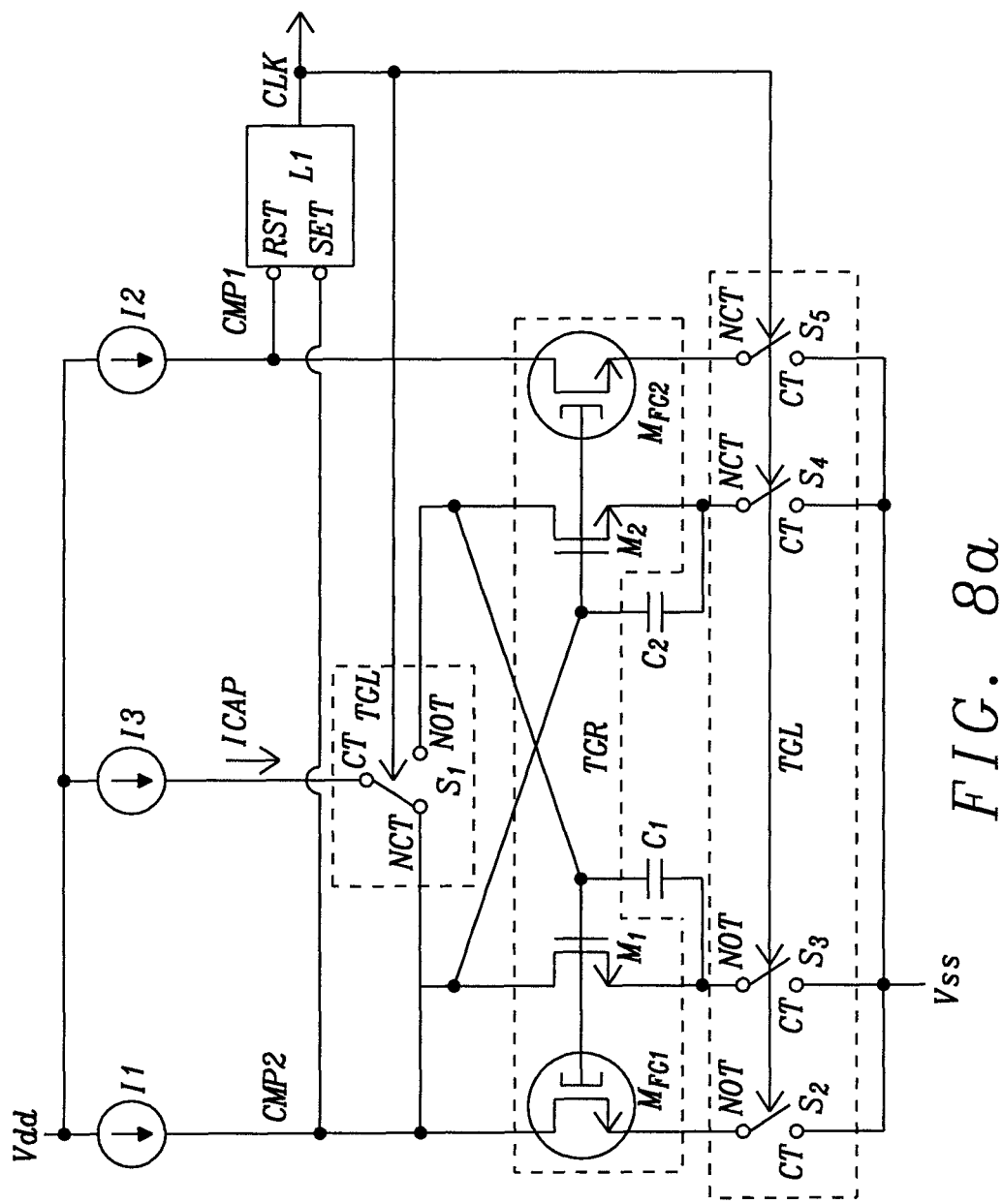
FIG. 8a is a simplified schematic diagram of a third implementation of a relaxation oscillator embodying the principals of the present disclosure.

FIG. 8a is a simplified schematic diagram of a third implementation of a relaxation oscillator embodying the principals of the present disclosure. This implementation of the relaxation oscillator has two frequency determining capacitors $C_1$ and $C_2$, toggle circuit TGL, and a trigger circuit TGR of FIG. 4. The toggle circuit TGL is formed of the toggle switch $S_1$, the normally closed switches $S_2$ and $S_4$, and the normally open switches $S_3$ and $S_5$.

The gate-source capacitance of a first and second normal NMOS transistors $M_1$ and $M_2$ may be used as the two frequency determining capacitors $C_1$ and $C_2$ rather than a separate, dedicated capacitor component. The trigger circuit TGR is connected to a first plate of the capacitor $C_1$ and to a first plate of the capacitor $C_2$. The trigger circuit TGR includes a flipped gate transistor $M_{FG1}$ having a threshold voltage that is the trigger voltage Vth_FGD and a normal NMOS transistor $M_1$ with a threshold voltage that is the trigger voltage Vth_nch. The trigger circuit includes a flipped gate transistor $M_{FG2}$ having the threshold voltage that is the trigger voltage Vth_nch and a normal NMOS transistor $M_2$ with the threshold voltage that is the trigger voltage Vth_nch.

The gate of the first flipped gate transistor $M_{FG1}$ is connected to the gate of a normal NMOS transistor $M_1$ and to a first plate of a first frequency determining capacitor $C_1$. A second plate of the capacitor $C_1$ is connected to a source of the NMOS transistor $M_1$. A drain of the flipped gate transistor $M_{FG1}$ is connected to a first terminal a first current source I1 for receiving a first current. The second terminal of the current source I1 is connected to a power supply voltage source Vdd. The drain of the flipped gate transistor $M_{FG1}$ and the first terminal of the current source I1 are connected to a set terminal SET of a set/reset latch L1. The source of the flipped gate transistor $M_{FG1}$ is connected to a normally open terminal NOT of the switch $S_2$. The source of the NMOS transistor $M_1$ and the second plate of the capacitor $C_1$ is connected to a normally closed terminal NCT of the $S_3$. The drain of the NMOS transistor $M_1$ is connected to a connected to a normally closed terminal NCT of the toggling switch $S_1$.

The gate of the second flipped gate transistor $M_{FG2}$ is connected to the gate of a normal NMOS transistor $M_2$ and to a first plate of a second frequency determining capacitor $C_2$. A second plate of the capacitor $C_2$ is connected to a source of the NMOS transistor $M_2$. A drain of the flipped gate transistor $M_{FG2}$ is connected to a first terminal a second current source I2 for receiving a second current. The second terminal of the current source I2 is connected to a power supply voltage source Vdd. The drain of the flipped gate transistor $M_{FG2}$ and the first terminal of the current source I1 are connected to a reset terminal RST of a set/reset latch L1. The source of the flipped gate transistor $M_{FG2}$ is connected to a normally closed terminal NCT of the switch $S_5$. The source of the NMOS transistor $M_2$ and the second plate of the capacitor $C_2$ is connected to a normally closed terminal NCT of the $S_4$. The drain of the NMOS transistor $M_2$ is a connected to a normally open terminal NOT of the toggling switch $S_1$. The gate of the NMOS transistor $M_2$ and the first plate of the capacitor $C_2$ are connected to the drain of the NMOS transistor $M_1$ and the normally closed terminal NCT of the switch $S_1$. The gate of the NMOS transistor $M_1$ and the first plate of the capacitor $C_1$ are connected to the drain of the NMOS transistor $M_2$ and the normally open terminal NOT of the switch $S_1$. The common terminals of the switches $S_2$, $S_3$, $S_4$ and $S_5$ are is connected to the reference voltage source Vss.

A current source I3 provides a capacitor charging current ICAP to the common terminal CT of the toggling switch $S_1$. The control terminal for each of the switches $S_1$, $S_2$, $S_3$, $S_4$ and $S_5$ is connected to the output signal CLK of the set/reset latch L1. When the output signal CLK of the set/reset latch L1 is in its deactivated state (0), the toggling switch $S_1$ is connected such that the capacitor charging current ICAP is applied to the drain of the NMOS transistor $M_1$, to the gate of the NMOS transistor $M_2$, and to the first plate of the capacitor $C_2$. Similarly, When the output signal CLK of the set/reset latch L1 is in its deactivated state (0), the switches $S_2$ and $S_3$ are opened and the switches $S_4$ and $S_5$ are closed such that the sources of the flipped gate transistor $M_{FG2}$, NMOS transistor $M_2$ and the second plate of the capacitor $C_2$ are connected to the reference voltage source Vss. The sources of the flipped gate transistor $M_{FG1}$, NMOS transistor $M_1$ and the second plate of the capacitor $C_1$ are disconnected and floating.

When the output signal CLK of the set/reset latch L1 is in its activated state (1), the toggling switch $S_1$ is connected such that the capacitor charging current ICAP is applied to the drain of the NMOS transistor $M_2$, to the gate of the NMOS transistor $M_1$, and to the first plate of the capacitor $C_1$. Similarly, When the output signal CLK of the set/reset latch L1 is in its activated state (1), the switches $S_2$ and $S_3$ are closed and the switches $S_4$ and $S_5$ are open such that the sources of the flipped gate transistor $M_{FG1}$, NMOS transistor $M_1$ and the second plate of the capacitor $C_1$ are connected to the reference voltage source Vss. The sources of the flipped gate transistor $M_{FG2}$, NMOS transistor $M_1$ and the second plate of the capacitor $C_2$ are disconnected and floating.

Figure 8B:
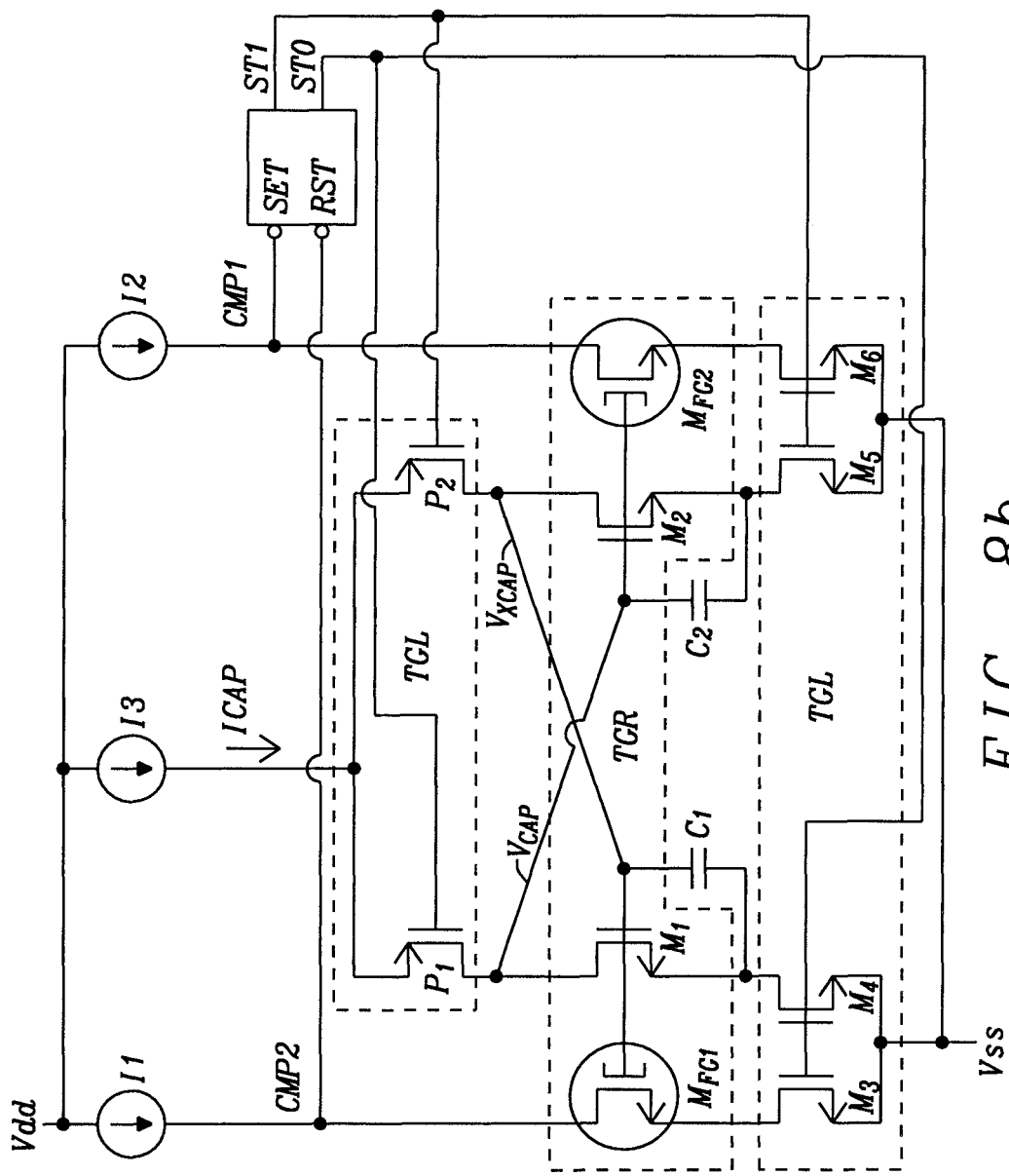
FIG. 8b is a detailed schematic diagram of the third implementation of the relaxation oscillator of FIG. 8a embodying the principals of the present disclosure.

FIG. 8b is a detailed schematic diagram of the second implementation of the relaxation oscillator of FIG. 8a embodying the principals of the present disclosure. The structure of the relaxation oscillator of FIG. 8b is identical to that of FIG. 8a. The toggle circuit TGL of FIG. 8b performs the function of the toggling switch $S_1$ of FIG. 8a. The set/reset latch L1 in FIG. 8b has two output ST1 and ST0 that have opposite states for the states for the states of the input signals CMP1 and CMP2. The switches $S_2$, $S_3$, $S_4$ and $S_5$ of the toggle circuit TGL are respectively implemented by the NMOS transistors $M_3$, $M_4$, $M_5$, and $M_6$. The reset signal ST0 is connected to the gates of the NMOS transistors $M_3$ and $M_4$ and the set signal ST1 is connected to the gates of the NMOS transistors $M_5$, and $M_6$. Thus, the NMOS transistors $M_3$ and $M_4$ are conducting as the normally closed switches $S_2$ and $S_3$ in the reset state (the output signal ST0=1 and ST1=0) and the NMOS transistors $M_5$ and $M_6$ are not conducting as the normally closed switches $S_4$ and $S_5$ in the reset state (the output signal ST0=1 and ST1=0). In the set state (the output signal ST0=0 and ST1=1), the NMOS transistors $M_3$ and $M_4$ are not conducting as the normally closed switches $S_2$ and $S_3$ in the set state and the NMOS transistors $M_5$ and $M_6$ are conducting as the normally closed switches $S_4$ and $S_5$ in the set state.

The relaxation oscillator has a trigger circuit TGR that is connected to a first plate of the capacitor $C_1$ and to a first plate of the capacitor $C_2$. The second plates of the capacitors $C_1$ and $C_2$ are connected to the sources of the NMOS transistors $M_1$ and $M_2$.

As described above the trigger circuit TGR includes a flipped gate transistor $M_{FG1}$ having a threshold voltage that is the trigger voltage VTH_FGD and a normal NMOS transistor $M_1$ with a threshold voltage and a normal NMOS transistor having a threshold voltage that is the trigger voltage VTH_nch. The first plate of the capacitor $C_1$ is connected to a gate of the flipped gate transistor $M_{FG1}$ and a gate of the NMOS transistor $M_1$. The trigger circuit TGR includes a flipped gate transistor $M_{FG2}$ having the threshold voltage that is the trigger voltage VTH_FGD and a normal NMOS transistor $M_1$ with the threshold voltage that is the trigger voltage VTH_nch.

Figure 9A:
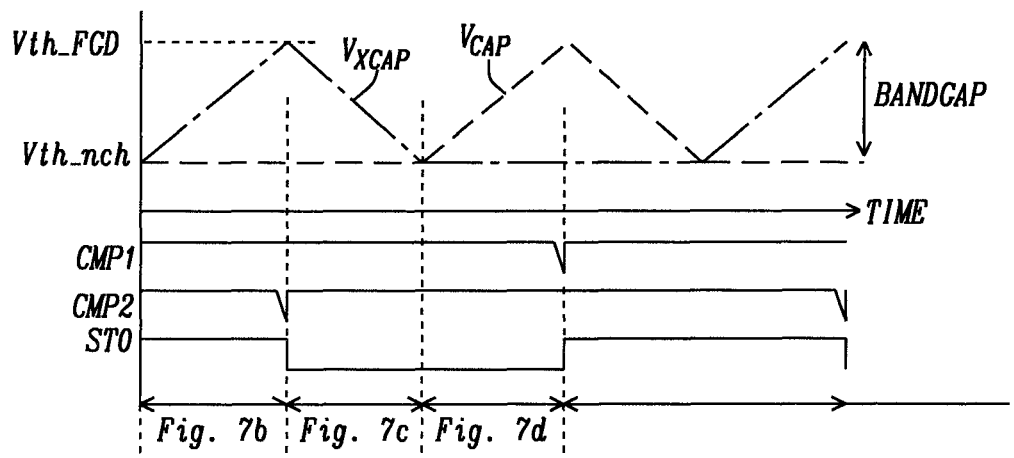
FIG. 9a is a plot showing signals at various points during operation of the relaxation oscillator of FIG. 8b embodying the principals of the present disclosure.
Figure 9B:
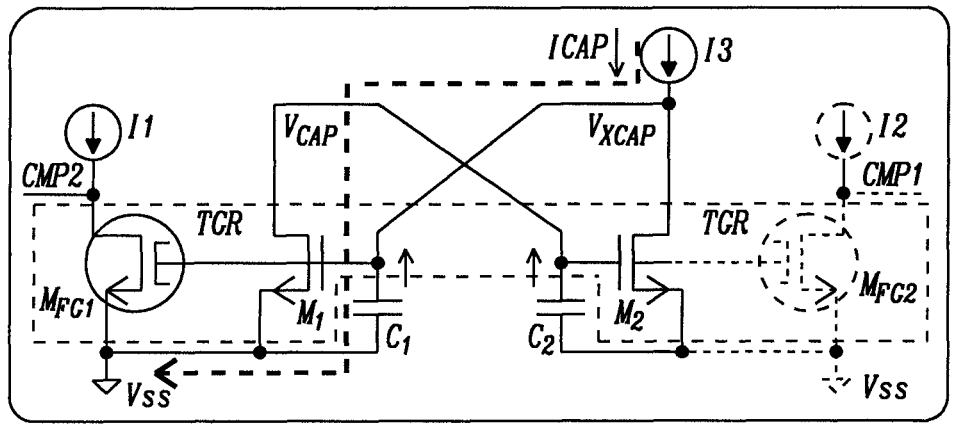
FIGS. 9b-9d are simplified schematics showing the current flow during operation of the relaxation oscillator of FIG. 8b embodying the principals of the present disclosure.
Figure 9C:
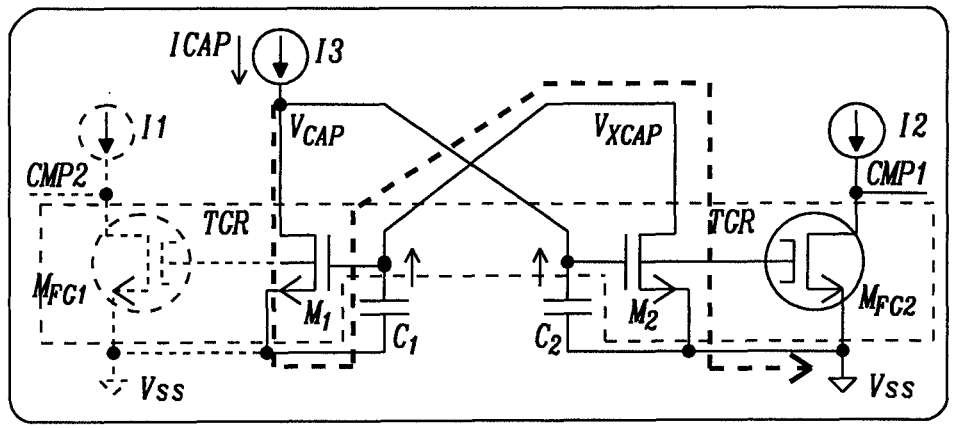
Figure 9D:
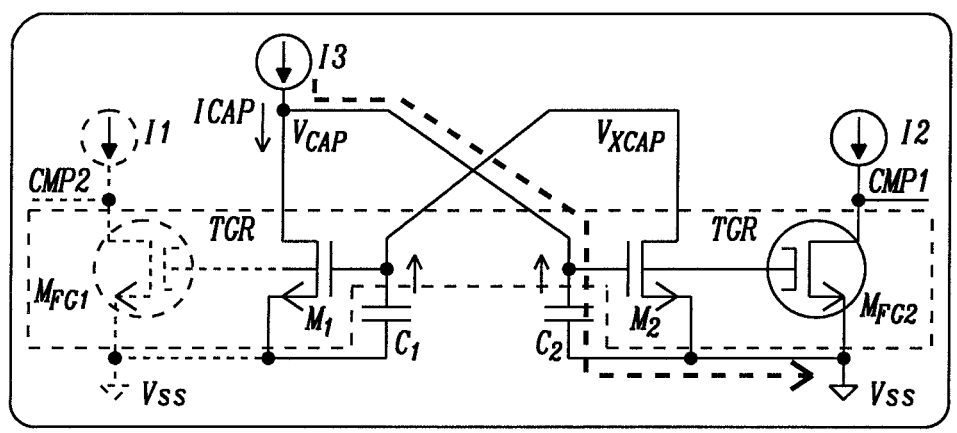

FIG. 9a is a plot showing signals at various points during operation of the relaxation oscillator of FIG. 8b embodying the principals of the present disclosure. FIGS. 9b-9d are simplified schematics showing the current flow during operation of the relaxation oscillator of FIG. 8b embodying the principals of the present disclosure. Referring to FIGS. 8b, 9a, and 9b, the circuit of FIG. 8b is initialized in the set state with the output signal ST0 being activated (1) and the output signal ST1 being deactivated (0). The PMOS transistor P1 is turned off and the PMOS transistor P2 is turned on. The NMOS transistors $M_3$ and $M_4$ are turned on and the NMOS transistors $M_5$ and $M_6$ are turned off. The charging current ICAP flows through the PMOS transistor P2 to charge the first plate of the first capacitor $C_1$ such that the voltage $V_{XCAP}$ increases from the threshold voltage Vth_nch of the NMOS transistor $M_2$ to the threshold voltage Vth_FGD of the flipped gate transistor $M_{FG1}$. The flipped gate transistor $M_{FG1}$ turns on and the current from the current source I1 flows through the flipped gate transistor $M_{FG1}$ to the reference voltage source Vss. The second comparison signal CMP2 drops to cause the reset input RST of the set/reset latch L1 to reset and the reset output ST0 to be placed at a deactivated state (0).

The set output ST1 of the set/reset latch L1 is activated (1) to turn off the PMOS transistor P2. With the reset output ST0 to be placed at a deactivated state (0), the PMOS transistor P1 is turned on such that the charging current ICAP flows through the PMOS transistor P1 to charge the first plate of the capacitor $C_2$ such that the voltage $V_{CAP}$ increases from the threshold voltage Vth_nch of the NMOS transistors $M_2$ to the threshold voltage Vth_FGD of the flipped gate transistor $M_{FG2}$. The charge on capacitor $C_1$ flows through the NMOS transistor M₂ and the NMOS transistors M₅ to the reference voltage source Vss to discharge the capacitor $C_1$ until the voltage across capacitor $C_1$ has decreased to the voltage level of the threshold voltage Vth_nch as shown in FIG. 7c. Referring to FIG. 7d, the NMOS transistor $M_1$ is turned off. The capacitor charging current ICAP charges the capacitor $C_2$ and when the voltage $V_{CAP}$ at the first plate of the capacitor $C_2$ reaches the threshold voltage Vth_FGD of the flipped gate transistor $M_{FG2}$, the flipped gate transistor $M_{FG3}$ turns on and the current from the current source I2 flows through the flipped gate transistor $M_{FG3}$ to the reference voltage source Vss. The first comparison signal CMP1 drops to cause the set input SET of the set/reset latch L1 to set and the set output ST1 to be placed at a deactivated state (0) and the reset output ST0 is placed at the activated state (1). At this time, the cycle as described above repeats itself continuously.

Figure 10A:
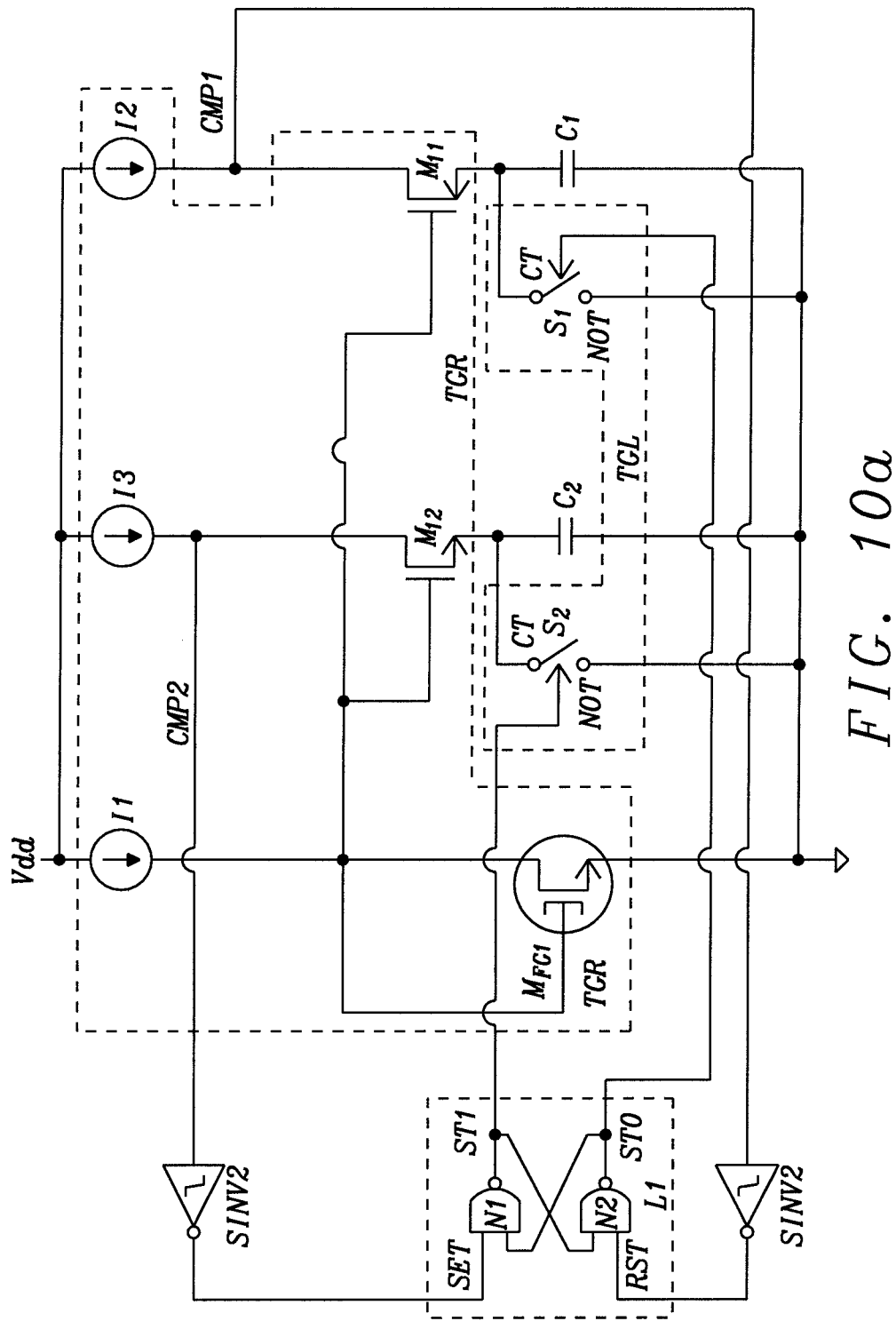
FIG. 10a is a schematic diagram of a fourth implementation of a relaxation oscillator embodying the principals of the present disclosure.

FIG. 10a is a schematic diagram of a fourth implementation of a relaxation oscillator embodying the principals of the present disclosure. The relaxation oscillation circuit has two frequency determining capacitors $C_1$ and $C_2$, a trigger circuit TGR, and a toggle circuit TGL. The trigger circuit TGR, and a toggle circuit TGL are connected to a first plate of the capacitors $C_1$ and $C_2$. The trigger circuit TGR includes a flipped gate transistor $M_{FG1}$ having a first threshold voltage that is the trigger voltage Vth_FGD and a first normal NMOS transistor $M_{11}$ and a second normal NMOS transistor $M_{12}$ with a threshold voltage that is the trigger voltage Vth_nch. The gate and drain of the flipped gate transistor $M_{FG1}$ are connected to form a diode. The gate and drain of the diode connected flipped gate transistor $M_{FG1}$ are connected to the first terminal of the current source I1. The gate and drain of the diode connected flipped gate transistor $M_{FG1}$ are further connected to the gates of the normal NMOS transistor $M_{11}$ and the normal NMOS transistor $M_{12}$ to generate the trigger voltage Vth_FGD that is applied to the gates of the normal NMOS transistors $M_{11}$ and $M_{12}$.

The drain of the normal NMOS transistor $M_{11}$ is connected to a first terminal of the current source $I_2$. The drain of the normal NMOS transistor $M_{12}$ is connected to a first terminal of the current source I3 and the set input SET of the set/reset latch L1. The toggle circuit TGL includes the switches $S_1$ and $S_2$. The source of the normal NMOS transistor $M_{11}$ is connected to the common terminal of the switch $S_1$. The source of the normal NMOS transistor $M_{12}$ is connected to the common terminal of the switch $S_2$.

The second terminals of the current sources I1, I2 and I3 are connected to the power supply voltage source Vdd. The normally open terminals of the switches $S_1$ and $S_2$ are connected to the reference voltage source Vss.

The set/reset latch L1 is formed of the cross-coupled NAND gates N1 and N2. A first input of the NAND gate N1 forms the set input SET of the set/reset latch L1. The input of the Schmitt trigger inverter SINV1 is connected to receive the comparison signal CMP2 from the junction of the drain of the NMOS transistor $M_{11}$ and the first terminal of the current source I2 and the output of the Schmitt trigger SINV1 is connected to transfer the inverted comparison signal $\overline{CMP2}$ to the set input SET of the set/reset latch L1. A second input of the NAND gate N1 is connected to an output ST0 of the second NAND gate N2. The first input of the NAND gate N2 is connected to the output ST1 of the first NAND gate N1. The second input of the NAND gate N2 forms the reset input RST of the set/reset latch L1. The input of the Schmitt trigger inverter SINV2 is connected to receive the comparison signal CMP1 from the junction of the junction of the drain of the NMOS transistor $M_{12}$ and the first terminal of the current source I3 and the output of the Schmitt trigger SINV2 is connected to transfer the inverted comparison signal $\overline{CMP1}$ to the reset input RST of the set/reset latch L1. The reset output ST0 of the set/reset latch L1 is connected to the control terminal of the switch S1 of the toggle circuit TGL and the set output ST1 of the set/reset latch L1 is connected to the control terminal of the switch $S_2$ of the toggle circuit TGL. The Schmitt trigger inverters SINV1 and SINV2 have a threshold that prevents a false trigger upon receiving the two comparison signals CMP1 and CMP2.

Figure 10B:
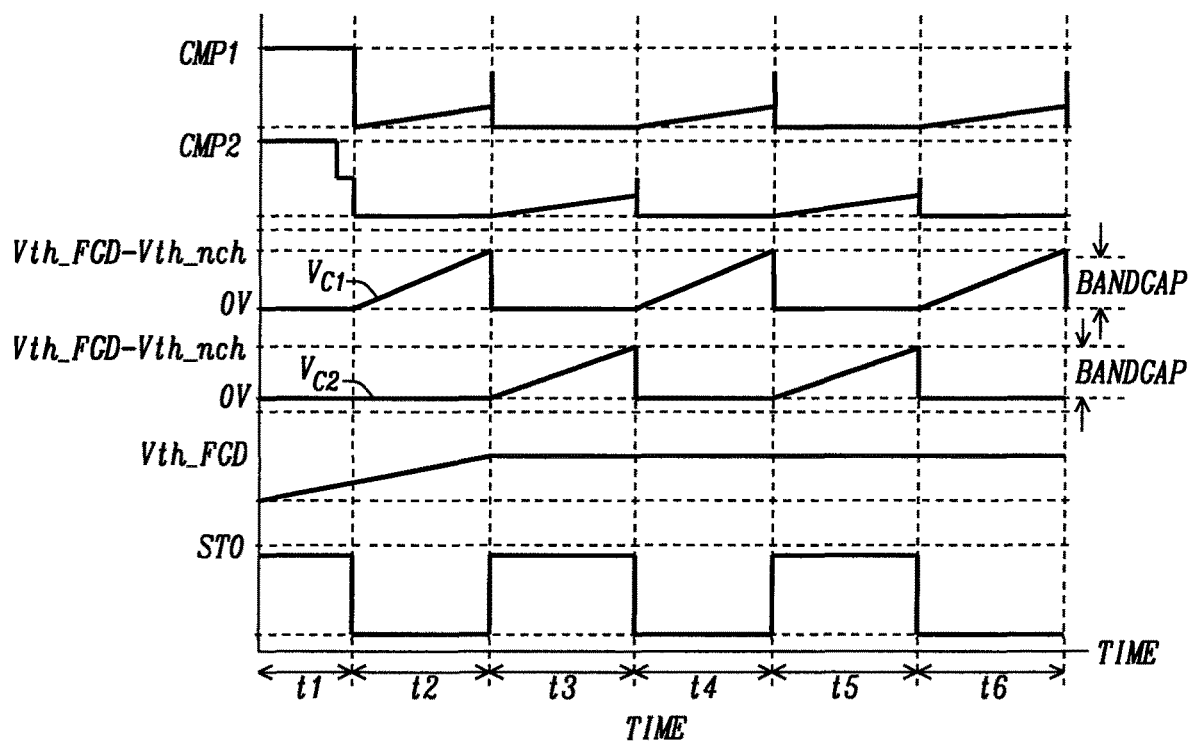
FIG. 10b is a plot showing signals at various points during operation of the relaxation oscillator of FIG. 10a embodying the principals of the present disclosure.

FIG. 10b is a plot showing signals at various points during operation of the relaxation oscillator of FIG. 10a embodying the principals of the present disclosure. During the time period τ1, the relaxation oscillator is initialized. During the time period τ2, the switch $S_1$ is opened and the voltage $V_{C1}$ at first plate of the capacitor $C_1$ begins to rise as the capacitor $C_1$ charges to the voltage of the bandgap voltage (BANDGAP=VTH_FGD−VTH_nch). With the NMOS transistor $M_{11}$ turned on, the voltage of the second comparison signal CMP1 is placed at essentially the voltage level of the capacitor voltage $VC_1$. Also, during the time period τ2, the NMOS transistor $M_{12}$ is turned on and the voltage of the second comparison signal CMP2 is placed at essentially the voltage level of the reference voltage level Vss. Thus, placing the reset signal ST0 at the activated state (1) and placing the set signal ST1 at the deactivated state (0). When capacitor voltage $VC_1$ reaches to trigger voltage VTH_nch, NMOS transistor $M_{11}$ turns off and comparison signal CMP1 is activated (1), the set input SET of the latch L1 is set to an activated state (1). The reset output signal ST0 is activated (1) and the set output signal ST1 is deactivated (0). The switch $S_2$ is opened and the switch $S_1$ is closed. The capacitor $C_1$ discharges to the voltage level of the reference voltage source Vss and the capacitor $C_2$ begins to charge.

During the time period τ3, the switch $S_1$ is closed and the voltage $VC_1$ at first plate of the capacitor $C_1$ discharges. With the NMOS transistor $M_{11}$ turned on, the voltage of the second comparison signal CMP1 is placed at essentially the voltage level of the reference voltage source Vss. The switch $S_2$ is opened and the voltage $V_{C2}$ at first plate of the capacitor $C_2$ rises as the capacitor $C_1$ charges to the bandgap voltage (BANGAP=VTH_FGD−VTH_nch). With the NMOS transistor $M_{12}$ turned on, the voltage of the comparison signal CMP2 is placed at essentially the voltage level of the capacitor voltage $VC_2$. When capacitor voltage $VC_2$ reaches to trigger voltage VTH_nch, NMOS transistor $M_{12}$ turns off and comparison signal CMP2 is activated (1), the set input SET of the latch L1 is set to an activated state (1). The set output signal ST1 is activated (1) and the reset output signal ST0 is deactivated (0). The switch $S_2$ is closed and the switch $S_1$ is open. The capacitor $C_2$ discharges to the voltage level of the reference voltage source Vss and the capacitor $C_1$ begins to charge to the bandgap voltage. The cycle as described for the time period τ2 is repeated for the time period τ4 and time period τ6. The time period τ3 is repeated for the time period τ5. The cycles as described are continue continuously.

Figure 11A:
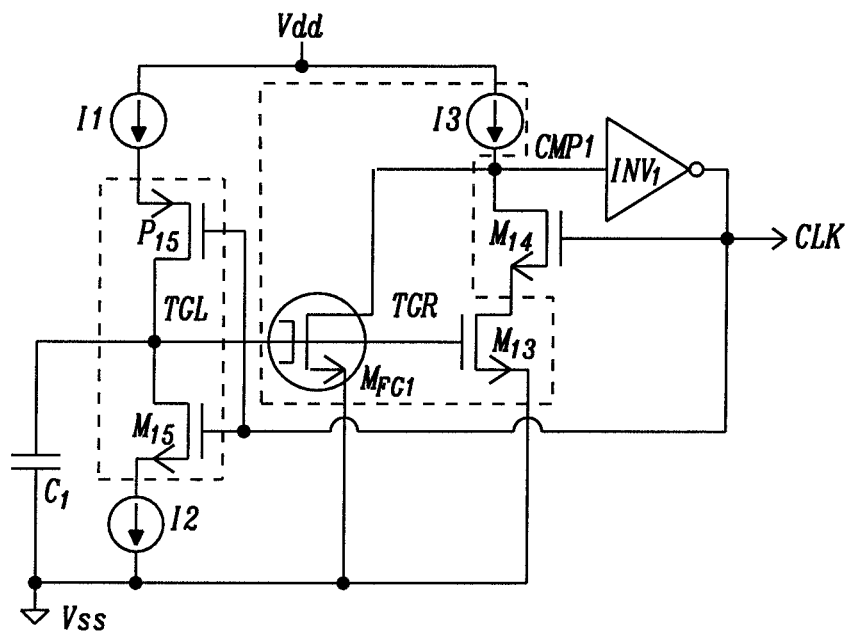
FIG. 11a is a schematic diagram of a fifth implementation of a relaxation oscillator embodying the principals of the present disclosure.

FIG. 11a is a schematic diagram of a fifth implementation of a relaxation oscillator embodying the principals of the present disclosure. The relaxation oscillation circuit has trigger circuit TGR, a toggle circuit TGL, and a frequency determining capacitors $C_1$. The trigger circuit TGR includes a flipped gate transistor $M_{FG1}$ having a first threshold voltage that is the trigger voltage Vth_FGD and a normal NMOS transistor $M_{13}$ with a second threshold voltage that is the trigger voltage Vth_nch. The trigger circuit TGR is structured such that the gates of the flipped gate transistor $M_{FG1}$ and the normal NMOS transistor $M_{13}$ are connected to a first plate of the capacitor $C_1$ and the toggle circuit TGL and thus to the drains of the toggling PMOS transistor $P_{15}$ and toggling NMOS transistor $M_{15}$. The toggle circuit TGL includes the toggling PMOS transistor $P_{15}$, the toggling NMOS transistor $M_{15}$, the current source I1, and the current sink I2. The source of the toggling PMOS transistor $P_{15}$ is connected to a first terminal of the current source I1 and the source of the NMOS transistor $M_{15}$ is connected to the first terminal of a current sink I2. The second terminal of the current source I1 is connected to the power supply voltage source Vdd and the second terminal of the current sink I2 is connected reference voltage source Vss. The drain of the flipped gate transistor $M_{FG1}$ is connected to a second terminal of a biasing current source I3, the drain of the NMOS transistor $M_{14}$, and the input of the inverter $INV_1$. The second terminal of the biasing current source I3 is connected to the power supply voltage source Vdd. The output of the inverter $INV_1$ forms the clock output CLK of the relaxation oscillator. The clock output CLK is connected to the gates of the NMOS transistor $M_{14}$, the toggling PMOS transistor $P_{15}$, and the toggling NMOS transistor $M_{15}$. The source of the NMOS transistor $M_{14}$ is connected to the drain of the normal NMOS transistor $M_{13}$. The sources of the flipped gate transistor $M_{FG1}$ and the normal NMOS transistor $M_{13}$ are connected to the reference voltage source Vss.

Figure 11B:
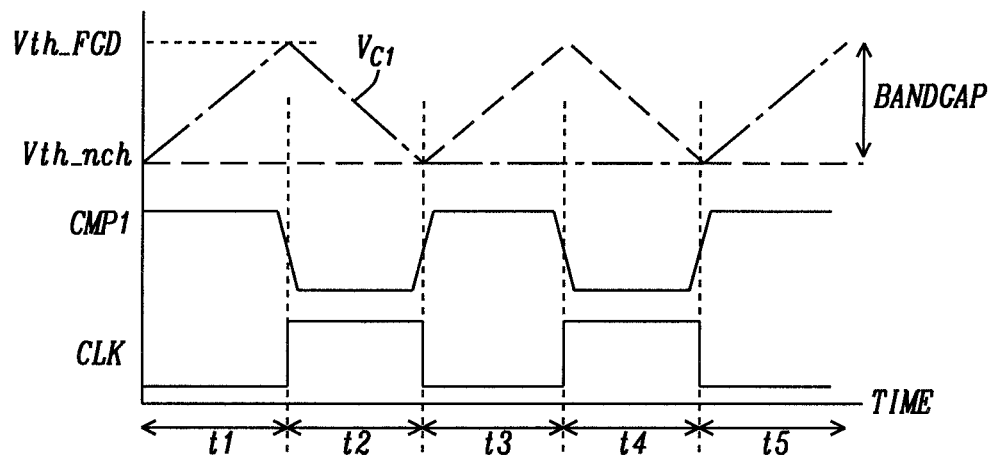
FIG. 11b is a plot showing signals at various points during operation of the relaxation oscillator of FIG. 11a embodying the principals of the present disclosure.

FIG. 11b is a plot showing signals at various points during operation of the relaxation oscillator of FIG. 11a embodying the principals of the present disclosure. Upon initialization, the flipped gate transistor $M_{FG1}$ and the normal NMOS transistor $M_{13}$ are turned off and the comparison signal CMP1 is forced to a high level (1). The output of the inverter I1 is placed at the low level (0), thus forcing the toggling transistor $M_{15}$ to turn off and turning on the toggling transistor $P_{15}$. The current from the current source I1 starts to charge the capacitor $C_1$ from the threshold voltage Vth_$N_{13}$ of the NMOS transistor $M_{13}$ to the threshold voltage Vth_FGD of the flipped gate transistor $M_{FG1}$ during the time period τ1. When voltage $VC_1$ reaches the threshold voltage Vth_FGD of the first flipped gate transistor $M_{FG1}$, the first flipped gate transistor $M_{FG1}$ turns on and the comparison signal CMP1 is forced to a low level (0). The output of the inverter I1 is placed at the high level (1), thus forcing the toggling NMOS transistor $M_{15}$ to turn on and turning off the toggling PMOS transistor $P_{15}$. The gating NMOS transistor $M_{14}$ is turned on and the current from the current source I3 flows through the NMOS transistor $M_{14}$ and NMOS transistor $M_{13}$. The voltage across the capacitor $C_1$ is less than the threshold voltage Vth_FGD of the flipped gate transistor $M_{FG1}$, thus turning off the flipped gate transistor $M_{FG1}$ during the time period τ2. When the voltage across the capacitor $C_1$ is less than the threshold voltage Vth_N13 of the NMOS transistor $M_{13}$, the NMOS transistor $M_{13}$ turns off and the comparison signal CMP1 forced to a high level at the end of the time period τ2.

The time periods τ3 and τ5 are the same at that of the time period τ1 and the time period τ4 is the same as the time period τ2. The toggling between the states of time period τ1 and the time period τ2 continues during the operation of the relation oscillator.

Figure 1:
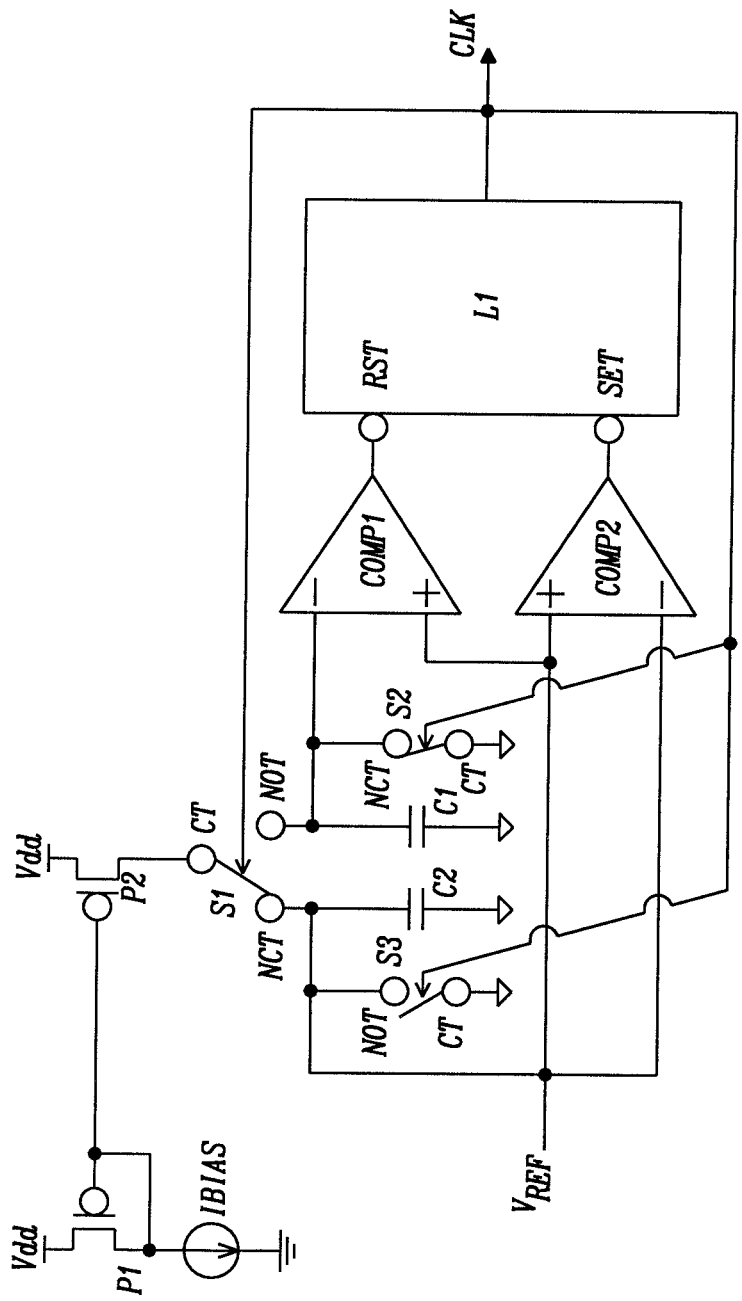
FIG. 1. is a schematic diagram of a relaxation oscillator of the prior art.

In all the implementations of the relaxation oscillator, as described above, the comparison of the threshold voltages of the flipped gate transistors with the normal transistors eliminates the separate reference voltage source VREF of FIG. 1. Thus, any kickback noise is eliminated.

It will be noted that the difference between the threshold voltage of the flipped gate transistors and the threshold voltage of the NMOS transistors of the above implementations is approximately the band gap voltage of the semiconductor material in which the devices are manufactured. In these implementations, the semiconductor material is preferably silicon, however any material having a suitable bandgap such as germanium, gallium arsenide, etc. may be used.

While this disclosure has been particularly shown and described with reference to the preferred embodiments thereof, it will be understood by those skilled in the art that various changes in form and details may be made without departing from the spirit and scope of the disclosure. For instance, the NMOS flipped gate transistors having a first threshold voltage and the normal NMOS transistors with a second threshold voltage may be implemented as PMOS transistors. Any PMOS transistors may be implemented as N-MOS transistors.

What is claimed is:

1. A relaxation oscillator comprising:
    a capacitor having a first plate and a second plate;
    a trigger circuit connected to the first plate and second plate of the capacitor and configured for monitoring a voltage developed across the capacitor and configured for setting at least one state variable signal for indicating that the voltage developed across the capacitor is less than or greater than a difference between a first trigger voltage and a second trigger voltage, wherein the first trigger voltage is a gate to source threshold voltage of a first transistor and the second trigger voltage is a gate to source threshold voltage of a second transistor, wherein the first transistor is arranged such its gate to source threshold voltage is greater than the gate to source threshold voltage of the second transistor;
    a toggle circuit configured for selectively providing a charging current to the first plate and from the second plate of the capacitor or the charging current to the second plate and from the first plate of the capacitor for charging or discharging the capacitor according to the at least one state variable signal; and
    a latch circuit connected to receive the at least one state variable signal and configured for retaining the at least one state variable signal, transferring the at least one state variable signal to the toggle circuit and providing an oscillator output signal.

2. The relaxation oscillator of claim 1 wherein the trigger circuit comprises
    a first comparator circuit having an inverting input connected to the first plate of the capacitor and a noninverting input and configured for determining that the voltage developed across the capacitor greater than a positive difference between the first trigger voltage and the second trigger voltage;
    a second comparator circuit having an inverting input connected to the first plate of the capacitor and a noninverting input and configured for determining that the voltage developed across the capacitor less than a negative difference between the first trigger voltage and the second trigger voltage;
    at least one first voltage source configured for generating the first trigger voltage and having a first terminal connected to the noninverting input of the first comparator and second terminal connected to a reference voltage source; and at least one second voltage source configured for generating the second trigger voltage and having a first terminal connected to the inverting input of the first comparator and the first plate of the capacitor connected to the toggle circuit;

wherein the output of the first comparator is connected to a reset terminal of the latch circuit and the output of the second comparator is connected to a set terminal of the latch circuit for transferring the at least one state variable signal to the latch circuit based on the positive and negative differences between the first trigger voltage and the second trigger voltage.

3. The relaxation oscillator of claim 2 further comprising a charging current source configured for generating the charging current for charging the capacitor from the first terminal to the second terminal and from the second terminal to the first terminal.

4. The relaxation oscillator of claim 3 wherein the toggle circuit comprises:
    a toggling switch having a common terminal connected to the charging current source for receiving the charging current;
    a normally open terminal connected to the first plate of the capacitor and the inverting terminal of the first comparator for receiving the charging current in the first state; and
    a normally closed terminal connected to the second plate of the capacitor and to the inverting terminal of the second comparator for receiving the charging current in the second state.

5. The relaxation oscillator of claim 4 wherein when the relaxation oscillator is placed in the first state and the oscillator output signal is deactivated, the voltage developed across the capacitor rises to the positive difference of the first trigger voltage and the second trigger voltage, at which time, a first state variable signal sets the latch and places the relaxation oscillator in the second state and activates the oscillator output signal.

6. The relaxation oscillator of claim 5 wherein when the relaxation oscillator is placed in the second state, the voltage developed across the capacitor falls to the negative difference between the first trigger voltage and the second trigger voltage, at which time, a second variable signal resets the latch and the relaxation oscillator is placed in the first state and the oscillator output changes to the inactive state, and the relaxation oscillator toggles repetitively between the first state and the second state.

7. The relaxation oscillator of claim 1 wherein the first transistor is a flipped gate MOS transistor and the second transistor is a normal MOS transistor.

8. The relaxation oscillator of claim 7 wherein the trigger circuit comprises:
    a first flipped gate MOS transistor comprising a gate connected to the first plate of the capacitor, a source, and a drain, and having the first gate to source threshold voltage;
    a second flipped gate MOS transistor comprising a gate connected to the second plate of the capacitor, source, and drain, and having the first gate to source threshold voltage;
    a first normal MOS transistor comprising a gate and drain connected together to form a first reference voltage source for the second trigger voltage and connected to the gate of the second flipped gate MOS transistor having the second gate to source threshold voltage;
    a second normal MOS transistor comprising a gate and drain connected together to form a second reference voltage source for the second trigger voltage and connected to the gate of the first flipped gate MOS transistor having the second gate to source threshold voltage;
    a first current source having a terminal connected to the drain of the first flipped gate MOS transistor for generating a first state variable signal of the at least one state variable signal indicating that a gate voltage of the first flipped gate MOS transistor is greater than the first gate to source threshold voltage; and
    a second current source having a terminal connected to the drain of the second flipped gate MOS transistor for generating a second state variable signal of the at least one state variable signal indicating that a gate voltage of the first flipped gate MOS transistor is greater than the first gate to source threshold voltage.

9. The relaxation oscillator of claim 8 wherein the toggle circuit comprises:
    a third current source having a terminal connected for transferring a charging current to the first plate and second plate of the capacitor to selectively charge and discharge the capacitor;
    a first toggling transistor having a source connected to the terminal of the third current source, a drain connected to the second plate of the capacitor and a gate connected to the latch circuit for receiving the first state variable signal for selectively transferring the charging current to the first plate of the capacitor;
    a second toggling transistor having a source connected to the terminal of the third current source, a drain connected to the first plate of the capacitor and a gate connected to the latch circuit for receiving the second state variable signal for selectively transferring the charging current to the first plate of the capacitor;
    a third toggling transistor having a gate connected to the latch circuit for receiving the first state variable signal and configured for selectively transferring the charging current from the first plate of the capacitor; and
    a fourth toggling transistor having a gate connected to the latch circuit for receiving the second state variable signal and configured for selectively transferring the charging current from the second plate of the capacitor.

10. The relaxation oscillator of claim 9 wherein when the state variable signal signifies a first state where the charging current is transferred to the first plate of the capacitor and from the second plate of the capacitor, such that the capacitor discharges to the second trigger voltage and then charges to the first trigger voltage.

11. The relaxation oscillator of claim 10 wherein when the state variable signal signifies a second state the charging current transferred to the second plate of the capacitor and from the second plate of the capacitor, such that the capacitor discharges to the second trigger voltage and then charges to the first trigger voltage.

12. A relaxation oscillator comprising:
    a first capacitor and a second capacitor each having a first plate and a second plate;
    a trigger circuit connected to the first plate and the second plate of the first and second capacitors and configured for monitoring a voltage developed across the first and second capacitors and configured for setting at least one state variable signal for indicating that the voltage developed across the first and second capacitors is less than or greater than a first trigger voltage and a second trigger voltage;
    a toggle circuit configured for selectively providing a charging current to the first plate and from the second plate of the first capacitor or the charging current to the second plate and from the first plate of the second capacitor for charging or discharging the first and second capacitors according to the at least one state variable signal; and a latch circuit connected to receive the at least one state variable signal and configured for retaining the at least one state variable signal, transferring the at least one state variable signal to the toggling circuit and providing an oscillator output signal.

13. The relaxation oscillator of claim 12 wherein the first trigger voltage is a first gate to source threshold voltage of a first transistor and the second trigger voltage is a second gate to source threshold voltage of a second transistor, wherein the first transistor is arranged such the first gate to source threshold voltage is greater than the second gate to source threshold voltage of the second transistor.

14. The relaxation oscillator of claim 13 wherein the first transistor is a flipped gate MOS transistor and the second transistor is a normal MOS transistor.

15. The relaxation oscillator of claim 14 wherein the trigger circuit comprises:
a first flipped gate MOS transistor comprising a gate connected to the first plate of the first capacitor, a source, and a drain, and having the first gate to source threshold voltage;
a second flipped gate MOS transistor comprising a gate connected to the second plate of the second capacitor, source, and drain, and having the first gate to source threshold voltage;
a first normal MOS transistor comprising a gate connected to the gate of the first flipped gate transistor and the first plate of the first capacitor, a drain connected to the gate of the second flipped gate MOS transistor, a source connected to the second plate of the first capacitor, and having the second gate to source threshold voltage; and
a second normal MOS transistor comprising a gate connected to the gate of the second flipped gate transistor, the first plate of the second capacitor and a drain connected to the gate of the first flipped gate MOS transistor, a source connected to the second plate of the second capacitor, and having the second gate to source threshold voltage;
a first current source having a terminal connected to the drain of the first flipped gate MOS transistor for generating a first state variable signal of the at least one state variable signal indicating that a gate voltage of the first flipped gate MOS transistor is greater than the first gate to source threshold voltage;
a second current source having a terminal connected to the drain of the second flipped gate MOS transistor for generating a second state variable signal of the at least one state variable signal indicating that a gate voltage of the first flipped gate MOS transistor is greater than the first gate to source threshold voltage.

16. The relaxation oscillator of claim 15 wherein the toggle circuit comprises:
a third current source having a terminal connected for transferring a charging current to the first plate and second plate of the first and second capacitors to selectively charge and discharge the first and second capacitors;
a first toggling switch having a common terminal connected to the terminal of the third current source, a normally closed terminal connected to the first plate of the second capacitor, a normally opened terminal connected to the first plate of the first capacitor and a control terminal connected to the latch circuit for receiving the first state variable signal for selectively transferring the charging current to the first plate of the first and second capacitors;
a second toggling switch having a normally opened terminal connected to a source of the first flipped gate MOS transistor, a common terminal connected to a reference voltage source, a control terminal connected to the latch circuit for receiving the second state variable signal for selectively transferring a current from the first current source for generating the first state variable signal;
a third toggling switch having a normally opened terminal connected to the second plate of the second capacitor and the source of the first normal MOS transistor, a common terminal connected to the reference voltage source, a control terminal connected to the latch circuit for receiving the first state variable signal for selectively transferring the charging current from the second plate of the first capacitor to the first plate of the second capacitor;
a fourth toggling switch having a normally closed terminal connected to a source of the second flipped gate MOS transistor, a common terminal connected to the reference voltage source, a control terminal connected to the latch circuit for receiving the at least one state variable signal for selectively transferring a current from the second current source for generating the second state variable signal of the at least one state variable signal; and
a fifth toggling switch having a normally closed terminal connected to the second plate of the second capacitor, a common terminal connected to the reference voltage source, a control terminal connected to the latch circuit for receiving the second state variable signal for selectively transferring the charging current from the second plate of the second capacitor.

17. The relaxation oscillator of claim 16 wherein when the state variable signal signifies a first state where the charging current transferred to the first plate of the first capacitor and discharged from the first plate of the second capacitor, such that the first capacitor charges to the first trigger voltage and the second capacitor discharges to the second trigger voltage.

18. The relaxation oscillator of claim 16 wherein when the state variable signal signifies a second state where the charging current transferred to the first plate of the second capacitor and discharged from the first plate of the first capacitor, such that the second capacitor charges to the first trigger voltage and the first capacitor discharges to the second trigger voltage.

19. The relaxation oscillator of claim 16 wherein the first toggling switch comprises a first toggling transistor having a source connected to the third current source, a drain connected to the drain of the first normal MOS transistor, the first plate of the second capacitor, the gate of the second normal MOS transistor, and the gate of the second flipped gate MOS transistor, and a gate connected to the latch circuit for receiving the first state variable signal for selectively transferring the charging current to the first plate of the second capacitor.

20. The relaxation oscillator of claim 16 wherein the first toggling switch further comprises a second toggling transistor having a source connected to the third current source, a drain connected to the drain of the second normal MOS transistor, the first plate of the first capacitor, the gate of the first normal MOS transistor, and the gate of the first flipped gate MOS transistor, and a gate connected to the latch circuit for receiving the second state variable signal for selectively transferring the charging current to the first plate of the second capacitor.

21. The relaxation oscillator of claim 16 wherein the second toggling switch comprises a third toggling transistor having a drain connected to the source of the first flipped gate MOS transistor, a source connected to the reference voltage source, and a gate connected to the latch circuit for receiving the second state variable signal for selectively transferring a current from the second current source for generating the second state variable signal.

22. The relaxation oscillator of claim 16 wherein the third toggling switch comprises a fourth toggling transistor having a drain connected to the source of the first normal MOS transistor and the second plate of the first capacitor, a source connected to the reference voltage source, and a gate connected to the latch circuit for receiving the second state variable signal for selectively transferring a current from the first plate of the second capacitor and from the second plate of the first capacitor.

23. The relaxation oscillator of claim 16 wherein the fourth toggling switch comprises a fifth toggling transistor having a drain connected to the source of the second flipped gate MOS transistor, a source connected to the reference voltage source, and a gate connected to the latch circuit for receiving the first state variable signal for selectively transferring a current from the first current source for generating the first state variable signal.

24. The relaxation oscillator of claim 16 wherein the fifth toggling switch comprises a sixth toggling transistor having a drain connected to the source of the second normal MOS transistor and the second plate of the second capacitor, a source connected to the reference voltage source, and a gate connected to the latch circuit for receiving the first state variable signal for selectively transferring a current from the first plate of the first capacitor and from the second plate of the second capacitor.

25. A relaxation oscillator comprising:
a first capacitor and a second capacitor each having a first plate and a second plate that is connected to a reference voltage source;
a trigger circuit connected to the first plate and second plate of the first and second capacitors and configured for monitoring a voltage developed across the first and second capacitors and configured for setting at least one state variable signal for indicating that the voltage developed across the first and second capacitors is less than or greater than a first trigger voltage and a second trigger voltage, wherein the first trigger voltage is a gate to source threshold voltage of a first transistor and the second trigger voltage is a gate to source threshold voltage of a second transistor, wherein the first transistor is arranged such its gate to source threshold voltage is greater than the gate to source threshold voltage of the second transistor;
a toggle circuit configured for selectively charging or discharging the first and second capacitors according to the at least one state variable signal; and
a latch circuit connected to receive the at least one state variable signal and configured for retaining the at least one state variable signal, transferring the at least one state variable signal to the toggling circuit and providing an oscillator output signal.

26. The relaxation oscillator of claim 25 wherein the first transistor is a flipped gate transistor and the second transistor is a normal MOS transistor.

27. The relaxation oscillator of claim 26 wherein the trigger circuit comprises:
a diode connected flipped gate transistor having a gate and drain connected together and a source connected to a reference voltage source;
a first current source connected to the gate and drain of the diode connected flipped gate transistor for biasing the diode connected flipped gate transistor for forming a first trigger voltage source;
a first normal MOS transistor having a source connected to the first plate of the first capacitor, a gate connected to the gate and drain of the diode connected flipped gate transistor;
a second current source connected to drain of the first normal MOS transistor for developing a first state variable signal;
a second normal MOS transistor having a source connected to the first plate of the second capacitor, a gate connected to the gate and drain of the diode connected flipped gate transistor;
a third current source connected to drain of the second normal MOS transistor for developing a second state variable signal.

28. The relaxation oscillator of claim 27 wherein the toggle circuit comprises:
a first normally open switch having a common terminal connected to the source of the first normal MOS transistor and the first plate of the first capacitor, a normally open terminal connected to the reference voltage source, and a gate connected to the latch circuit for receiving the first state variable signal of the at least one state variable signal;
a second normally open switch having a common terminal connected to the source of the second normal MOS transistor and the first plate of the second capacitor, a normally open terminal connected to the reference voltage source, and a gate connected to the latch circuit for receiving a second state variable signal of the at least one state variable signal.

29. The relaxation oscillator of claim 28 wherein the first and second normal MOS transistors are turned on for transferring the currents through the first and second normal MOS transistors, when the first state variable signal is deactivated and the second state variable signal is activated, the first normally open switch is closed and the second normally open switch is opened for charging the second capacitor, when the second capacitor charges to the second trigger level, the second normal MOS transistor turns off and the second state variable signal is deactivated and the first state variable signal is activated.

30. The relaxation oscillator of claim 29 wherein the first and second normal MOS transistors are turned on for transferring the currents through the first and second normal MOS transistors, when the first state variable signal is activated and the second state variable signal is deactivated, the first normally open switch is opened and the second normally open switch is closed for charging the first capacitor, when the second first charges to the second trigger level, the first normal MOS transistor turns off and the second state variable signal is activated and the first state variable signal is deactivated.

31. A relaxation oscillator comprising:
a capacitor each a first plate and a second plate connected to a reference voltage source;
a trigger circuit connected to the first plate configured for monitoring a voltage developed between the first plate of the capacitor and the reference voltage source and configured for setting at least one state variable signal for indicating that the voltage developed between the first plate of the capacitor and the reference voltage source is less than or greater than a first trigger voltage and a second trigger voltage, wherein the first trigger voltage is a gate to source threshold voltage of a first transistor and the second trigger voltage is a gate to source threshold voltage of a second transistor, wherein the first transistor is arranged such its gate to source threshold voltage is greater than the gate to source threshold voltage of the second transistor;

a toggle circuit configured for selectively charging or discharging the capacitor according to the at least one state variable signal; and a latch circuit connected to receive the at least one state variable signal and configured for retaining the at least one state variable signal, transferring the at least one state variable signal to the toggling circuit and providing an oscillator output signal.

32. The relaxation oscillator of claim 31 wherein the first transistor is a flipped gate transistor and the second transistor is a normal MOS transistor.

33. The relaxation oscillator of claim 32 wherein the trigger circuit comprises:
a flipped gate transistor having a gate connected to the first plate of the capacitor, a source connected to the reference voltage source, and a drain;
a biasing current source connected to the drain of the flipped gate transistor for biasing the flipped gate transistor for setting the at least one state variable signal;
a normal MOS transistor having a gate connected to the first plate of the capacitor, source connected to the reference voltage source, and a drain connected to the latch circuit.

34. The relaxation oscillator of claim 32 wherein the latch circuit comprises:
an inverter circuit having a first input connected to the drain of the flipped gate transistor and the biasing current source for receiving the at least one state variable signal and configured for generating an inverse of the at least one state variable signal that is retained and an output for providing the clock signal that is the at least one state variable signal selecting the charging and discharging of the capacitor; and
a gating transistor having a drain connected to the drain of the flipped gate transistor and the biasing current source for holding the at least one state variable signal, a source connected to the drain of the normal MOS transistor for gating the change of the level of the at least one state variable signal.

35. The relaxation oscillator of claim 34 wherein the trigger circuit comprises:
a first toggle switch having a drain connected to the first plate of the capacitor, a gate connected for receiving the clock signal, a source;
a charging current source connected to the source of the first toggle switch for providing a charging current to the first plate of the capacitor;

a second toggle switch having a drain connected to the first plate of the capacitor, a gate connected for receiving the clock signal, a source; and
a discharging current sink connected to the source of the first toggle switch for accepting a discharging current from the first plate of the capacitor.

36. The relaxation oscillator of claim 35 wherein when the capacitor is discharged a clock output is to set a level that the first toggle switch is activated and the charging current source is charging the capacitor, when the voltage at the first plate of the capacitor exceeds the second trigger level the normal MOS transistor turns on and when the voltage at the first plate of the capacitor exceeds the first trigger level the flipped gate MOS transistor turns on, the state variable signal is deactivated and the inverter changes the clock signal that deactivates the first toggle switch and activates the second toggle switch and the gating transistor, the capacitor begins to discharge, the flipped gate transistor is turned off and the normal MOS transistor remains turned on, when the voltage across the capacitor reaches the second trigger level, the normal MOS transistor turns off and the state variable is activated and the output of the inverter is deactivated and the cycle repeats continuously.

37. A method for operating a relaxation oscillator:
providing a relaxation oscillator comprising:
a capacitor having a first plate and a second plate;
a trigger circuit connected to the first plate and second plate of the capacitor,
a toggle circuit connected to the first and second plates of the capacitor for selectively providing a charging current;
a latch circuit connected to the trigger circuit and the toggle circuit;
monitoring a voltage developed across the capacitor;
setting a state variable signal for indicating that the voltage developed across the capacitor is less than or greater than a difference between a first trigger voltage and a second trigger voltage, wherein the first trigger voltage is a gate to source threshold voltage of a first transistor and the second trigger voltage is a gate to source threshold voltage of a second transistor, wherein the first transistor is arranged such its gate to source threshold voltage is greater than the gate to source threshold voltage of the second transistor;
selectively providing a charging current to the first plate and from the second plate of the capacitor or the charging current to the second plate and from the first plate of the capacitor for charging or discharging the capacitor according to the state variable signal;
transferring the state variable signal from the latch circuit;
retaining by the latch circuit the state variable signal; and
transferring the state variable signal to the toggling circuit and providing an oscillator output signal to external circuits.

38. The method of claim 37 wherein the first transistor is a flipped gate transistor and the second transistor is a normal MOS transistor.

* * * * *